United States Patent
Shin et al.

(10) Patent No.: US 12,484,400 B2
(45) Date of Patent: Nov. 25, 2025

(54) DISPLAY DEVICE WHERE FIRST ELECTRODES HAVE A SAME OVERLAPPING STRUCTURE TO ALLOW FOR IMPROVED ALIGNMENT

(71) Applicant: Samsung Display Co., LTD., Yongin-si (KR)

(72) Inventors: Dong Hee Shin, Asan-si (KR); Na Hyeon Cha, Yongin-si (KR); Min Kyu Woo, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 493 days.

(21) Appl. No.: 17/973,836

(22) Filed: Oct. 26, 2022

(65) Prior Publication Data

US 2023/0276666 A1    Aug. 31, 2023

(30) Foreign Application Priority Data

Feb. 25, 2022   (KR) ......................... 10-2022-0025224

(51) Int. Cl.
*H01L 29/08* (2006.01)
*H10D 86/40* (2025.01)
(Continued)

(52) U.S. Cl.
CPC ......... *H10K 59/131* (2023.02); *H10D 86/441* (2025.01); *H10D 86/481* (2025.01);
(Continued)

(58) Field of Classification Search
CPC ............. H10K 59/131; H10K 59/1213; H10K 59/1216; H10D 96/441; H10D 86/60; H10D 86/481
(Continued)

(56) References Cited

U.S. PATENT DOCUMENTS 10,249,698 B2 * 4/2019 Han .................... H10K 59/131
11,415,851 B2   8/2022 Shin et al.
(Continued)

FOREIGN PATENT DOCUMENTS

JP      2021141067 A  *  9/2021  .......... G09G 3/3233
KR   10-2021-0055829     5/2021
(Continued)

OTHER PUBLICATIONS

Cite the machine translation Han B (JP-2021141067-A).*

*Primary Examiner* — Phuc T Dang
(74) *Attorney, Agent, or Firm* — Womble Bond Dickinson (US) LLP

(57) ABSTRACT

A display device comprises a pixel circuit of each of first to third pixels disposed on a substrate, first to third vertical gate lines extending in a first direction and disposed on a side of the pixel circuit of each of the first to third pixels, respectively, a horizontal gate line extending in a second direction intersecting the first direction and disposed on the first to third vertical gate lines, a first electrode of each of the first to third pixels extending in the first direction and disposed on the horizontal gate line, and a second electrode of each of the first to third pixels extending in the first direction, the second electrode and the first electrode being disposed in a same layer. The first electrode of the first pixel overlaps the first vertical gate line, and the first electrode of the second pixel overlaps the second vertical gate line.

20 Claims, 13 Drawing Sheets

(51) Int. Cl.
    *H10D 86/60* (2025.01)
    *H10K 59/121* (2023.01)
    *H10K 59/131* (2023.01)
(52) U.S. Cl.
    CPC ......... *H10D 86/60* (2025.01); *H10K 59/1213* (2023.02); *H10K 59/1216* (2023.02)
(58) Field of Classification Search
    USPC ........................................................ 257/40
    See application file for complete search history.

(56) References Cited

U.S. PATENT DOCUMENTS

| | | | |
|---|---|---|---|
| 11,430,376 B2 | 8/2022 | Jang | |
| 11,714,325 B2 | 8/2023 | Shin et al. | |
| 12,025,894 B2 | 7/2024 | Shin et al. | |
| 2013/0113766 A1* | 5/2013 | Kim | G09G 3/3674 |
| | | | 438/34 |
| 2019/0027090 A1* | 1/2019 | Nonaka | G02F 1/13454 |
| 2021/0249490 A1* | 8/2021 | Lee | H10K 59/1216 |
| 2024/0353723 A1 | 10/2024 | Shin et al. | |

FOREIGN PATENT DOCUMENTS

| | | |
|---|---|---|
| KR | 10-2021-0127847 | 10/2021 |
| KR | 10-2021-0151272 | 12/2021 |

\* cited by examiner

DISPLAY DEVICE WHERE FIRST ELECTRODES HAVE A SAME OVERLAPPING STRUCTURE TO ALLOW FOR IMPROVED ALIGNMENT

CROSS-REFERENCE TO RELATED APPLICATION(S)

This application claims priority to and benefits of Korean Patent Application No. 10-2022-0025224 under 35 U.S.C. § 119, filed on Feb. 25, 2022, in the Korean Intellectual Property Office (KIPO), the entire contents of which are incorporated herein by reference.

BACKGROUND

1. Technical Field

The disclosure relates to a display device.

2. Description of the Related Art

As the information society develops, the demand for display devices for displaying images has increased and diversified. For example, display devices have been applied to various electronic devices such as smartphones, digital cameras, laptop computers, navigation devices, and smart televisions. The display devices may be flat panel display devices such as liquid crystal display devices, field emission display devices, or organic light emitting display devices. Among such flat panel display devices, a light emitting display device may display an image without a backlight unit providing light to a display panel because each of pixels of the display panel includes light emitting elements that may emit light by themselves. The light emitting element may be an organic light emitting diode that uses an organic material as a fluorescent material and an inorganic light emitting diode that uses an inorganic material as a fluorescent material.

SUMMARY

Aspects of the disclosure may provide a display device capable of improving reliability of an alignment process of light emitting elements and improving luminous efficiency of a display panel.

However, aspects of the disclosure may not be restricted to those set forth herein. The above and other aspects of the disclosure will become more apparent to one of ordinary skill in the art to which the disclosure pertains by referencing the detailed description of the disclosure given below.

According to an embodiment of the disclosure, a display device comprises a pixel circuit of each of a first pixel, a second pixel, and a third pixel disposed on a substrate, a first vertical gate line, a second vertical gate line, a third vertical gate line extending in a first direction and disposed on a side of the pixel circuit of each of the first to third pixels, respectively, a horizontal gate line extending in a second direction intersecting the first direction and disposed on the first to third vertical gate lines, a first electrode of each of the first to third pixels extending in the first direction and disposed on the horizontal gate line, and a second electrode of each of the first to third pixels extending in the first direction, the second electrode and the first electrode being disposed in a same layer. The first electrode of the first pixel overlaps the first vertical gate line in a thickness direction, and the first electrode of the second pixel overlaps the second vertical gate line in the thickness direction.

The display device may further comprise a first vertical voltage line disposed on a side of the first vertical gate line and supplying a high-potential voltage. The first electrode of the first pixel may overlap the first vertical voltage line in the thickness direction.

The display device may further comprise a first data line disposed on a side of the second vertical gate line and supplying a data voltage to the pixel circuit of the first pixel. The first electrode of the second pixel may overlap the first data line in the thickness direction.

The first electrode of the third pixel may overlap the third vertical gate line in the thickness direction.

The display device may further comprise a second data line disposed on a side of the third vertical gate line and supplying a data voltage to the pixel circuit of the second pixel. The first electrode of the third pixel may overlap the second data line in the thickness direction.

The second electrode of each of the first to third pixels may overlap the pixel circuit of each of the first to third pixels in the thickness direction.

Each of the first to third pixels may include light emitting elements aligned between the first electrode and the second electrode. The pixel circuit of each of the first to third pixels may include a first transistor supplying a driving current to the light emitting element, a second transistor electrically connecting a data line to a first node that is a gate electrode of the first transistor based on a gate signal, a third transistor electrically connecting an initialization voltage line to a second node that is a source electrode of the first transistor based on the gate signal, and a first capacitor electrically connected between the first node and the second node.

Each of the first to third pixels may include a first light emitting element, a second light emitting element, a third light emitting element, and a fourth light emitting element aligned between the first and second electrodes, a first contact electrode disposed on the first and second electrodes and electrically connected between the pixel circuit and the first light emitting element, a second contact electrode electrically connected between the first and second light emitting elements, a third contact electrode electrically connected between the second and third light emitting elements, a fourth contact electrode electrically connected between the third and fourth light emitting elements, and a fifth contact electrode electrically connected between the fourth light emitting element and a low potential line.

The display device may further comprise a flexible film disposed on a side of the substrate, and a display driver disposed on the flexible film. One of the first to third vertical gate lines may supply a gate signal received from the display driver to the horizontal gate line.

The first electrode may include a first portion extending in the first direction, a second portion spaced apart from the first portion with the horizontal gate line being disposed between the first portion and the second portion, and a third portion overlapping the horizontal gate line in the thickness direction and spaced apart from the first and second portions.

According to an embodiment of the disclosure, a display device comprises a pixel circuit of each of a first pixel, a second pixel, and a third pixel disposed on a substrate, a first vertical gate line, a second vertical gate line, and a third vertical gate line extending in a first direction and disposed on a side of the pixel circuits of each of the first to third pixels, respectively, a first data line, a second data line, and a third data line extending in the first direction and disposed on another side of the pixel circuits of each of the first to third pixels opposite to the side, respectively, a horizontal gate line extending in a second direction intersecting the first direction and disposed on the first to third vertical gate lines, and a first voltage line supplying a high-potential voltage to the pixel circuit of each of the first to third pixels, the first voltage line and the horizontal gate line being disposed in a same layer.

The display device may further comprise a first electrode of each of the first to third pixels extending in the first direction and disposed on the horizontal gate line, and a second electrode of each of the first to third pixels extending in the first direction. The first electrode and the second electrode may be disposed in a same layer.

The first electrode of the first pixel may overlap the first vertical gate line in a thickness direction, the first electrode of the second pixel may overlap the second vertical gate line in the thickness direction, and the first electrode of the third pixel may overlap the third vertical gate line in the thickness direction.

The display device may further comprise a first vertical voltage line disposed on a side of the first vertical gate line and supplying a high-potential voltage. The first electrode of the first pixel may overlap the first vertical voltage line in a thickness direction.

The first electrode of the second pixel may overlap the first data line in a thickness direction, and the first electrode of the third pixel may overlap the second data line in the thickness direction.

The second electrode of each of the first to third pixels may overlap the pixel circuit of each of the first to third pixels in a thickness direction.

Each of the first to third pixels may include light emitting elements aligned between the first electrode and the second electrode. The pixel circuit of each of the first to third pixels may include a first transistor supplying a driving current to the light emitting elements, a second transistor electrically connecting a data line to a first node that is a gate electrode of the first transistor based on a gate signal, a third transistor electrically connecting an initialization voltage line to a second node that is a source electrode of the first transistor based on the gate signal, and a first capacitor electrically connected between the first node and the second node.

Each of the first to third pixels may include a first light emitting element, a second light emitting element, a third light emitting element, and a fourth light emitting element aligned between the first and second electrodes, a first contact electrode disposed on the first and second electrodes and electrically connected between the pixel circuit and the first light emitting element, a second contact electrode electrically connected between the first and second light emitting elements, a third contact electrode electrically connected between the second and third light emitting elements, a fourth contact electrode electrically connected between the third and fourth light emitting elements, and a fifth contact electrode electrically connected between the fourth light emitting element and a low potential line.

The display device may further comprise a flexible film disposed on a side of the substrate, and a display driver disposed on the flexible film. One of the first to third vertical gate lines may supply a gate signal received from the display driver to the horizontal gate line.

The first electrode may include a first portion extending in the first direction, a second portion spaced apart from the first portion with the horizontal gate line being disposed between the first portion and the second portion, and a third portion overlapping the horizontal gate line in a thickness direction and spaced apart from the first and second portions.

A display device according to embodiments includes first electrodes of first to third pixels overlapping vertical voltage lines and second electrodes of the first to third pixels overlapping pixel circuits, such that reliability of an alignment process of light emitting elements may be improved to solve a misalignment problem of the light emitting elements, and alignment areas of the light emitting elements may be secured as large as possible to improve luminous efficiency of a display panel.

The effects of the disclosure are not limited to the aforementioned effects, and various other effects are included in the specification.

BRIEF DESCRIPTION OF THE DRAWINGS

The above and other aspects and features of the disclosure will become more apparent by describing in detail example embodiments thereof with reference to the attached drawings, in which.

DETAILED DESCRIPTION OF THE EMBODIMENTS

Figure 1:
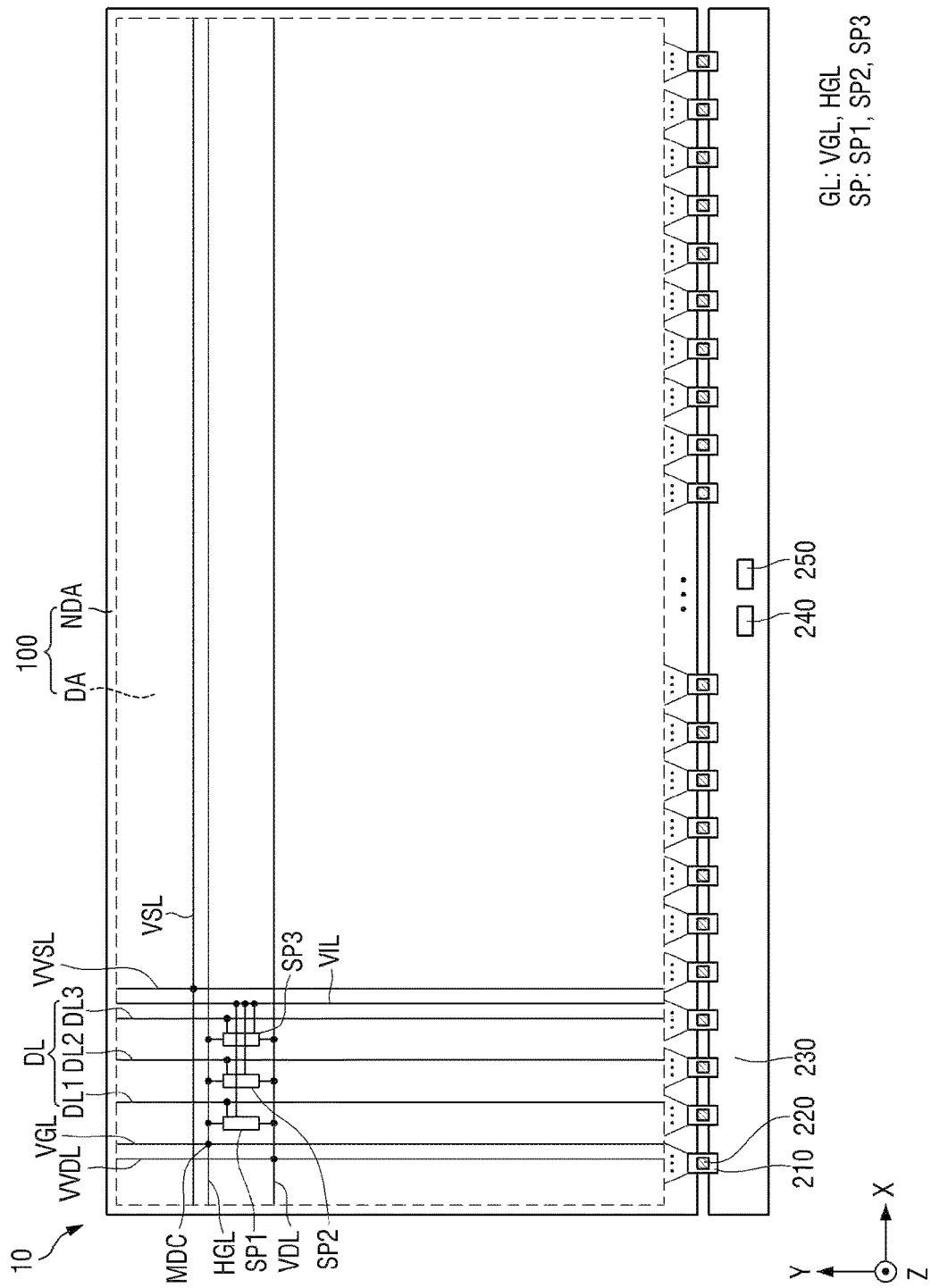
FIG. 1 is a schematic plan view illustrating a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

The term "overlap" or "at least partially overlap" as used herein may mean that at least part of a first object faces at least part of a second object in a given direction or given view.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

Hereinafter, detailed embodiments of the disclosure will be described with reference to the accompanying drawings.

FIG. 1 is a schematic plan view illustrating a display device according to an embodiment.

The terms "above", "top", and "upper surface" as used herein may refer to an upward direction (i.e., a Z-axis direction) with respect to the display device. The terms "below", "bottom", and "lower surface" as used herein may refer to a downward direction (i.e., a direction opposite to the Z axis direction) with respect to the display device. The terms "left", "right", "upper", and "lower" may refer to directions in case that the display device is viewed from above. For example, "left" refers to a direction opposite to an X-axis direction, "right" may refer to the X-axis direction, "upper" refers to a Y-axis direction, and "lower" may refer to a direction opposite to the Y-axis direction.

Referring to FIG. 1, a display device 10 may be a device that displays a moving image or a still image, and may be used as a display screen of various products such as televisions, laptop computers, monitors, billboards, and Internet of Things (JOT) as well as portable electronic devices such as mobile phones, smartphones, tablet personal computers (PCs), smart watches, watch phones, mobile communication terminals, electronic organizers, electronic books, portable multimedia players (PMPs), navigation devices, and ultra mobile PCs (UMPCs), or the like.

The display device 10 may include a display panel 100, flexible films 210, display drivers 220, a circuit board 230, a timing controller 240, and a power supply part 250.

The display panel 100 may have a rectangular shape in a plan view. For example, the display panel 100 may have a rectangular shape, in a plan view, having long sides in a first direction (X-axis direction) and short sides in a second direction (Y-axis direction). A corner where the long side in the first direction (X-axis direction) and the short side in the second direction (Y-axis direction) meet may be right-angled, or may be rounded with a curvature (e.g., a predetermined or selectable curvature). A shape of the display panel 100 in a plan view is not limited to the rectangular shape, and may be other polygonal shapes, a circular shape, an elliptical shape, or the like. As an example, the display panel 100 may be formed to be flat, but is not limited thereto. As another example, the display panel 100 may be formed to be bent with a curvature.

The display panel 100 may include a display area DA and a non-display area NDA.

The display area DA may be an area displaying an image, and may be defined as a central area of the display panel 100. The display area DA may include pixels SP, gate lines GL, data lines DL, initialization voltage lines VIL, first voltage lines VDL, first vertical voltage lines VVDL, second voltage lines VSL, and second vertical voltage lines VVSL. The pixels SP may be formed in each of pixel areas crossed by the data lines DL and the gate lines GL. The pixels SP may include first pixel SP1, second pixel SP2, and third pixel SP3. Each of the first to third pixels SP1 to $SP_3$ may be connected to one horizontal gate line HGL and one data line DL. Each of the first to third pixels SP1 to SP3 may be defined as an area of a minimum unit emitting light.

The first pixel SP1 may emit light of a first color or red light, the second pixel SP2 may emit light of a second color or green light, and the third pixel SP3 may emit light of a third color or blue light. A pixel circuit of the first pixel SP1, a pixel circuit of the second pixel SP2, and a pixel circuit of the third pixel SP3 may be arranged in the first direction (X-axis direction), but an arrangement of the pixel circuits is not limited thereto.

The gate line GL may include a vertical gate line VGL and a horizontal gate line HGL.

The vertical gate lines VGL may be connected to the display drivers 220, may extend in the second direction (Y-axis direction), and may be spaced apart from each other in the first direction (X-axis direction). The vertical gate lines VGL may be disposed in parallel with the data lines DL. The horizontal gate lines HGL may extend in the first direction (X-axis direction), and may be spaced apart from each other in the second direction (Y-axis direction). The horizontal gate lines HGL may cross (or intersect) the vertical gate lines VGL. For example, one horizontal gate line HGL may be connected to one vertical gate line VGL of the vertical gate lines VGL through a contact part MDC. The contact part MDC may correspond to a portion where the horizontal gate line HGL is inserted into a contact hole to come into contact with the vertical gate line VGL. The horizontal gate line HGL may supply gate signals to the first to third pixels SP1 to SP3.

The data lines DL may extend in the second direction (Y-axis direction), and may be spaced apart from each other in the first direction (X-axis direction). The data lines DL may include first to third data lines DL1 to DL3. Each of the first to third data lines DL1 to DL3 may supply a data voltage to each of the first to third pixels SP1 to SP3.

The initialization voltage lines VIL may extend in the second direction (Y-axis direction), and may be spaced apart from each other in the first direction (X-axis direction). The initialization voltage lines VIL may supply initialization voltages received from the display drivers 220 to the pixel circuit of each of the first to third pixels SP1 to SP3. The initialization voltage lines VIL may receive sensed signals from the pixel circuit of each of the first to third pixels SP1 to SP3, and may supply the sensed signals to the display drivers 220.

The first vertical voltage lines VVDL may extend in the second direction (Y-axis direction), and may be spaced apart from each other in the first direction (X-axis direction). The first vertical voltage lines VVDL may supply a driving voltage or a high-potential voltage received from the power supply part 250 to the first voltage lines VDL.

The first voltage lines VDL may extend in the first direction (X-axis direction), and may be spaced apart from each other in the second direction (Y-axis direction). The first voltage lines VDL may supply the driving voltage or the high-potential voltage received from the first vertical voltage lines VVDL to the first to third pixels SP1 to SP3.

The second vertical voltage lines VVSL may extend in the second direction (Y-axis direction), and may be spaced apart from each other in the first direction (X-axis direction). The second vertical voltage lines VVSL may be connected to the second voltage lines VSL. The second vertical voltage lines VVSL may supply a low-potential voltage received from the power supply part 250 to the second voltage lines VSL.

The second voltage lines VSL may extend in the first direction (X-axis direction), and may be spaced apart from each other in the second direction (Y-axis direction). The second voltage lines VSL may be low potential lines. Accordingly, the second voltage lines VSL may supply the low-potential voltage received from the second vertical voltage lines VVSL to the first to third pixels SP1 to SP3.

Connection relationships between the pixels SP, the gate lines GL, the data lines DL, the initialization voltage lines VIL, the first voltage lines VDL, and the second voltage lines VSL may be changed in design according to the number and an arrangement of pixels SP.

The non-display area NDA may be defined as an area other than the display area DA in the display panel 100. For example, the non-display area NDA may include fan-out lines connecting the vertical gate lines VGL, the data lines DL, the initialization voltage lines VIL, the first vertical voltage lines VVDL, and the second vertical voltage lines VVSL to the display drivers 220 and pad parts (not illustrated) connected to the flexible films 210.

Input terminals provided on one sides (or first sides) of the flexible films 210 may be attached to the circuit board 230 by a film attaching process, and output terminals provided on another sides (or second sides) of the flexible films 210 may be attached to the pad parts by a film attaching process. For example, the flexible film 210 may be bent like a tape carrier package or a chip on film. The flexible films 210 may be bent below the display panel 100 in order to decrease a bezel area of the display device 10.

The display driver 220 may be mounted on the flexible film 210. For example, the display driver 220 may be implemented as an integrated circuit (IC). The display drivers 220 may receive digital video data and data control signals from the timing controller 240, may convert the digital video data into analog data voltages according to the data control signals, and may supply the analog data voltages to the data lines DL through the fan-out lines. The display drivers 220 may generate gate signals according to gate control signals supplied from the timing controller 240, and may sequentially supply the gate signals to the vertical gate lines VGL according to a set order. Accordingly, the display drivers 220 may simultaneously serve as data drivers and gate drivers. The display device 10 may include the display drivers 220 disposed on a lower side of the non-display area NDA, and thus, sizes of left, right, and upper sides of the non-display area NDA may be minimized.

The circuit board 230 may support the timing controller 240 and the power supply part 250, and may supply signals and power to the display drivers 220. For example, the circuit board 230 may supply a signal supplied from the timing controller 240 and a source voltage supplied from the power supply part 250 to the display drivers 220 in order to display an image in each of the pixels SP. To this end, signal lines and power lines may be provided on the circuit board 230.

The timing controller 240 may be mounted on the circuit board 230, and may receive image data and timing synchronization signals supplied from a display driving system or a graphic device through a user connector provided on the circuit board 230. The timing controller 240 may generate the digital video data by aligning the image data to be suitable for a pixel arrangement structure based on the timing synchronization signals, and may supply the generated digital video data to the display drivers 220. The timing controller 240 may generate the data control signals and the gate control signals based on the timing synchronization signals. The timing controller 240 may control a supply timing of data voltages of the display drivers 220 based on the data control signals, and may control a supply timing of the gate signals of the display drivers 220 based on the gate control signals.

The power supply part 250 may be disposed on the circuit board 230, and may supply a source voltage to the display drivers 220 and the display panel 100. For example, the power supply part 250 may generate the driving voltage or the high-potential voltage and supply the driving voltage or the high-potential voltage to the first vertical voltage lines VVDL, may generate the low-potential voltage and supply the low-potential voltage to the second vertical voltage lines VVSL, and may generate the initialization voltage and supply the initialization voltage to the initialization voltage lines VIL.

Figure 2:
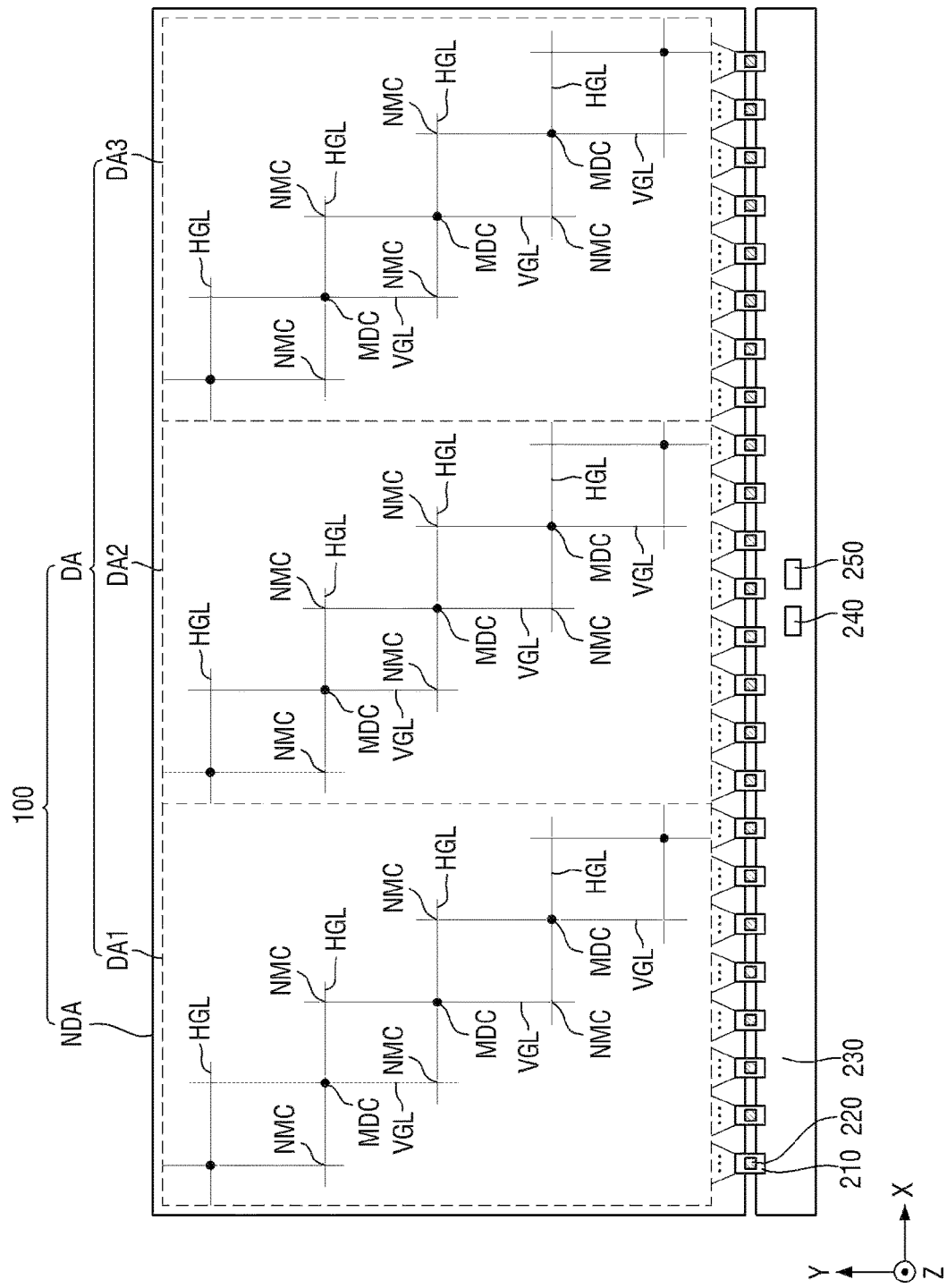
FIG. 2 is a schematic plan view illustrating contact parts of vertical gate lines and horizontal gate lines in the display device according to an embodiment.

FIG. 2 is a schematic plan view illustrating contact parts of vertical gate lines and horizontal gate lines in the display device according to an embodiment.

Referring to FIG. 2, the display area DA may include first display area DA1, second display area DA2, and third display area DA3.

The horizontal gate lines HGL may cross the vertical gate lines VGL. The horizontal gate lines HGL may cross the vertical gate lines VGL in contact parts MDC and non-contact parts NMC. For example, one horizontal gate line HGL of the horizontal gate lines HGL may be connected to one vertical gate line VGL of the vertical gate lines VGL through the contact part MDC. One horizontal gate line HGL of the horizontal gate lines HGL may be insulated from the other vertical gate lines VGL of the vertical gate lines VGL at the non-contact parts NMC.

The contact parts MDC of the first display area DA1 may be disposed on an extension line connecting an upper left side of the first display area DA1 to a lower right side of the first display area DA1. The contact parts MDC of the second display area DA2 may be disposed on an extension line connecting an upper left side of the second display area DA2 to a lower right side of the second display area DA2. The contact parts MDC of the third display area DA3 may be disposed on an extension line connecting an upper left side of the third display area DA3 to a lower right side of the third display area DA3. Accordingly, the contact parts MDC may be arranged in a diagonal direction between the first direction (X-axis direction) and a direction opposite to the second direction (Y-axis direction) in each of the first to third display areas DA1 to DA3.

The display device 10 may include the display drivers 220 serving as data drivers and gate drivers. Accordingly, the data lines DL receive the data voltages from the display drivers 220 disposed on a lower side of the non-display area NDA, and the vertical gate lines VGL receive the gate signals from the display drivers 220 disposed on the lower side of the non-display area NDA, such that sizes of a left side, a right side, and an upper side of the non-display area NDA of the display device 10 may be minimized.

Figure 3:
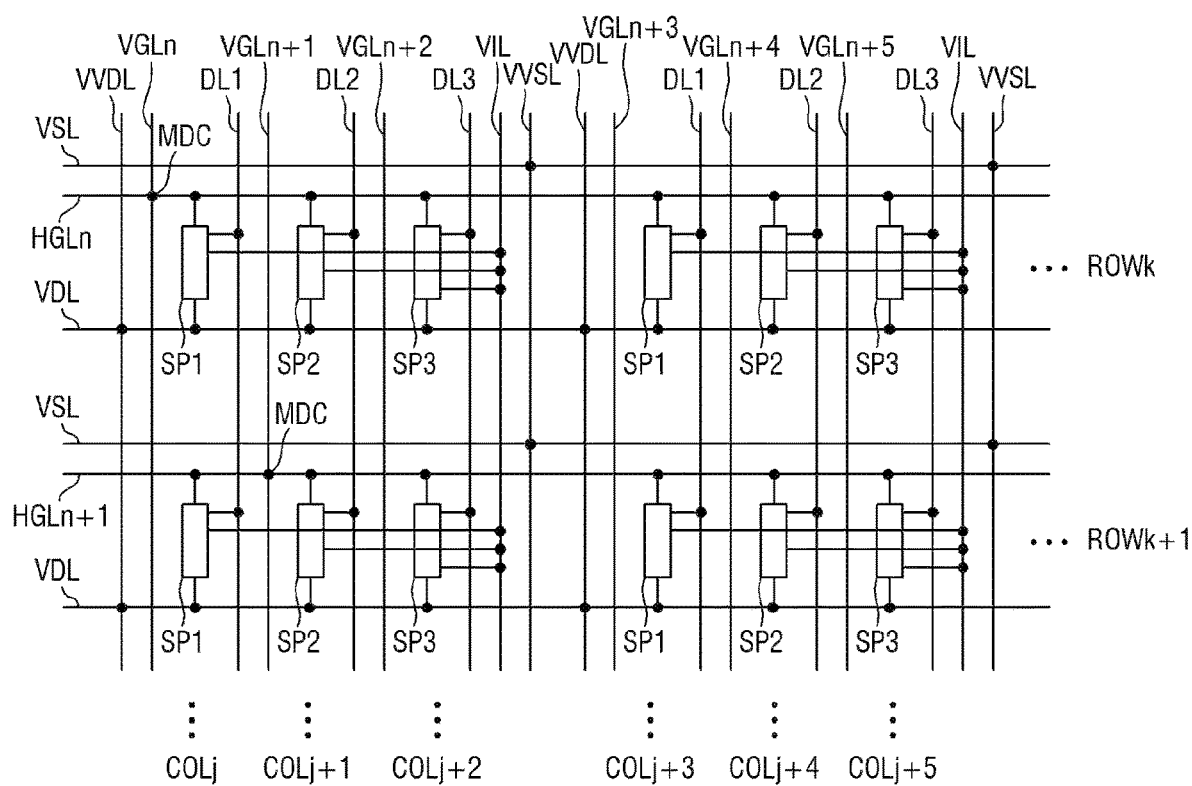
FIG. 3 is a schematic view illustrating pixels and lines of the display device according to an embodiment.
Figure 3:
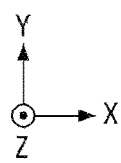

FIG. 3 is a schematic view illustrating pixels and lines of the display device according to an embodiment.

Referring to FIG. 3, the pixels SP may include first pixel SP1, second pixel SP2, and third pixel SP3. A pixel circuit of the first pixel SP1, a pixel circuit of the second pixel SP2, and a pixel circuit of the third pixel SP3 may be arranged in the first direction (X-axis direction), but an arrangement of the pixel circuits is not limited thereto.

Each of the first to third pixels SP1 to SP3 may be connected to the first voltage line VDL, the initialization voltage line VIL, the gate line GL, and the data line DL.

The first voltage line VDL may extend in the first direction (X-axis direction). The first voltage line VDL may be disposed on a lower side of the pixel circuits of the first to third pixels SP1 to SP3. The first voltage line VDL may supply the driving voltage or the high-potential voltage to a transistor of each of the first to third pixels SP1 to SP3.

The first vertical voltage line VVDL may extend in the first direction (X-axis direction). The first vertical voltage line VVDL may be disposed on a left side of the vertical gate line VGL disposed on a left side of the pixel circuit of the first pixel SP1. For example, the first vertical voltage line VVDL may be disposed on a left side of an n-th vertical gate line VGLn (here, n is a positive integer) or an n+3-th vertical gate line VGLn+3. The first vertical voltage line VVDL may be connected to the first voltage line VDL. The first vertical voltage line VVDL may supply the driving voltage or the high-potential voltage to the first voltage line VDL.

The gate line GL may include a vertical gate line VGL and a horizontal gate line HGL.

The vertical gate lines VGL may extend in the second direction (Y-axis direction). The vertical gate line VGL may be disposed on a left side of the pixel circuit of each of the first to third pixels SP1 to SP3. The vertical gate line VGL may be connected between the display driver 220 (see, e.g., FIG. 2) and the horizontal gate line HGL. The vertical gate lines VGL may cross the horizontal gate lines HGL. The vertical gate lines VGL may supply the gate signals received from the display drivers 220 to the horizontal gate lines HGL.

For example, the n-th vertical gate line VGLn may be disposed on the left side of the pixel circuit of the first pixel SP1 disposed in a j-th column COLj (here, j is a positive integer). An n+1-th vertical gate line VGLn+1 may be disposed on the left side of the pixel circuit of the second pixel SP2 disposed in a j+1-th column COLj+1. An n+2-th vertical gate line VGLn+2 may be disposed on the left side of the pixel circuit of the third pixel SP3 disposed in a j+2-th column COLj+2. The n+3-th vertical gate line VGLn+3 may be disposed on the left side of the pixel circuit of the first pixel SP1 disposed in a j+3-th column COLj+3. An n+4-th vertical gate line VGLn+4 may be disposed on the left side of the pixel circuit of the second pixel SP2 disposed in a j+4-th column COLj+4. An n+5-th vertical gate line VGLn+5 may be disposed on the left side of the pixel circuit of the third pixel SP3 disposed in a j+5-th column COLj+5.

The n-th vertical gate line VGLn may be connected to an n-th horizontal gate line HGLn through the contact part MDC, and may be insulated from the other horizontal gate lines HGL. The n+1-th vertical gate line VGLn+1 may be connected to an n+1-th horizontal gate line HGLn+1 through the contact part MDC, and may be insulated from the other horizontal gate lines HGL.

The horizontal gate lines HGL may extend in the first direction (X-axis direction). The horizontal gate lines HGL may be disposed on an upper side of the pixel circuit of the first to third pixels SP1 to SP3. The horizontal gate lines HGL may supply the gate signals received from the vertical gate lines VGL to the first to third pixels SP1 to SP3.

For example, the n-th horizontal gate line HGLn may be disposed on the upper side of the pixel circuits of the first to third pixels SP1 to SP3 disposed in a k-th row ROWk (here, k is a positive integer). The n-th horizontal gate line HGLn may be connected to the n-th vertical gate line VGLn through the contact part MDC, and may be insulated from the other vertical gate lines VGL. The n+1-th horizontal gate line HGLn+1 may be disposed on the upper side of the pixel circuits of the first to third pixels SP1 to SP3 disposed in a k+1-th row ROWk+1. The n+1-th horizontal gate line HGLn+1 may be connected to the n+1-th vertical gate line VGLn+1 through the contact part MDC, and may be insulated from the other vertical gate lines VGL.

The data lines DL may extend in the second direction (Y-axis direction). The data lines DL may supply the data voltages to the pixels SP. The data lines DL may include first to third data lines DL1 to DL3.

The first data lines DL1 may extend in the second direction (Y-axis direction). The first data line DL1 may be disposed on a right side of the pixel circuit of the first pixel SP1. The first data line DL1 may be disposed between the n-th vertical gate line VGLn and the n+1-th vertical gate line VGLn+1. The first data line DL1 may supply the data voltage received from the display driver 220 to the pixel circuit of the first pixel SP1.

The second data lines DL2 may extend in the second direction (Y-axis direction). The second data line DL2 may be disposed on a right side of the pixel circuit of the second pixel SP2. The second data line DL2 may be disposed between the n+1-th vertical gate line VGLn+1 and the n+2-th vertical gate line VGLn+2. The second data DL2 may supply the data voltage received from the display driver 220 to the pixel circuit of the second pixel SP2.

The third data lines DL3 may extend in the second direction (Y-axis direction). The third data line DL3 may be disposed on a right side of the pixel circuit of the third pixel SP3. The third data line DL3 may be disposed between the n+2-th vertical gate line VGLn+2 and the initialization voltage line VIL. The third data line DL3 may supply the data voltage received from the display driver 220 to the pixel circuit of the third pixel SP3.

The initialization voltage lines VIL may extend in the second direction (Y-axis direction). The initialization voltage line VIL may be disposed on a right side of the third data line DL3. The initialization voltage line VIL may be disposed between the third data line DL3 and the second vertical voltage line VVSL. The initialization voltage line VIL may supply the initialization voltage to the pixel circuit of each of the first to third pixels SP1 to SP3. The initialization voltage line VIL may receive sensed signals from the pixel circuit of each of the first to third pixels SP1 to SP3, and may supply the sensed signals to the display driver 220.

The second vertical voltage lines VVSL may extend in the second direction (Y-axis direction). The second vertical voltage line VVSL may be disposed on a right side of the initialization voltage line VIL. The second vertical voltage line VVSL may be connected between the power supply part 250 (see, e.g., FIG. 2) and the second voltage line VSL. The second vertical voltage line VVSL may supply the low-potential voltage supplied from the power supply part 250 to the second voltage line VSL.

The second voltage lines VSL may extend in the first direction (X-axis direction). The second voltage line VSL may be disposed on an upper side of the horizontal gate line HGL. The second voltage line VSL may supply the low-potential voltage received from the second vertical voltage line VVSL to a light emitting element layer of the first to third pixels SP1 to SP3.

Figure 4:
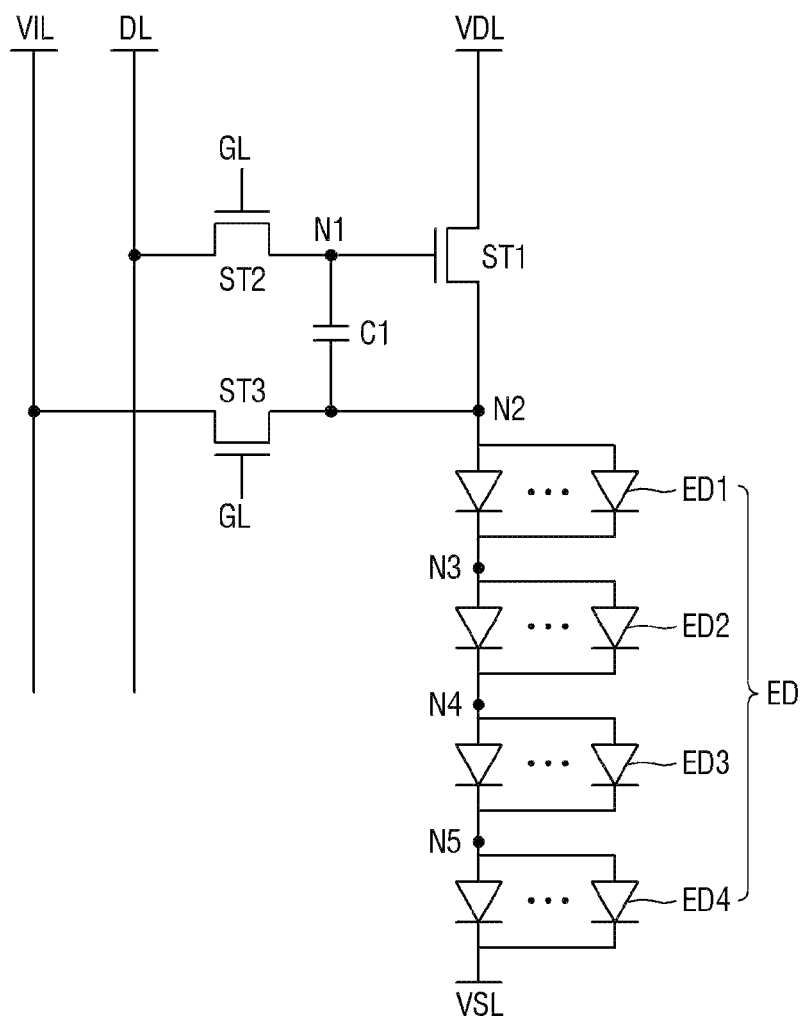
FIG. 4 is a schematic diagram of an equivalent circuit illustrating a pixel of the display device according to an embodiment.

FIG. 4 is a schematic diagram of an equivalent circuit illustrating a pixel of the display device according to an embodiment.

Referring to FIG. 4, each of the pixels SP may be connected to the first voltage line VDL, the data line DL, the initialization voltage line VIL, the gate line GL, and the second voltage line VSL.

Each of first to third pixels SP1 to SP3 may include a first transistor ST1, a second transistor ST2, a third transistor ST3, a first capacitor C1, and light emitting elements ED.

The first transistor ST1 may include a gate electrode, a drain electrode, and a source electrode. The gate electrode of the first transistor ST1 may be connected to a first node N1, the drain electrode of the first transistor ST1 may be connected to the first voltage line VDL, and the source electrode of the first transistor ST1 may be connected to a second node N2. The first transistor ST1 may control a drain-source current (or a driving current) based on a data voltage applied to the gate electrode.

The light emitting elements ED may include first light emitting elements ED1, second light emitting elements ED2, third light emitting elements ED3, and fourth light emitting elements ED4. The first to fourth light emitting elements ED1 to ED4 may be connected to each other in series. The first light emitting elements ED1 may be connected to each other in parallel. The second light emitting elements ED2 may be connected to each other in parallel. The third light emitting elements ED3 may be connected to each other in parallel. The fourth light emitting elements ED4 may be connected to each other in parallel. The first to fourth light emitting elements ED1 to ED4 may receive the driving current to emit light. A light emission amount or luminance of the light emitting element ED may be proportional to a magnitude of the driving current. The light emitting element ED may be an inorganic light emitting element including an inorganic semiconductor, but is not limited thereto.

A first electrode of the first light emitting element ED1 may be connected to the second node N2, and a second electrode of the first light emitting element ED1 may be connected to a third node N3. The first electrode of the first light emitting element ED1 may be connected to the source electrode of the first transistor ST1, a drain electrode of the third transistor ST3, and a second capacitor electrode of the first capacitor C1 through the second node N2. The second electrode of the first light emitting element ED1 may be connected to a first electrode of the second light emitting element ED2 through the third node N3.

The first electrode of the second light emitting element ED2 may be connected to the third node N3, and a second electrode of the second light emitting element ED2 may be connected to a fourth node N4. A first electrode of the third light emitting element ED3 may be connected to the fourth node N4, and a second electrode of the third light emitting element ED3 may be connected to a fifth node N5. A first electrode of the fourth light emitting element ED4 may be connected to the fifth node N5, and a second electrode of the fourth light emitting element ED4 may be connected to the second voltage line VSL.

The second transistor ST2 may be turned on by a gate signal of the gate line GL to electrically connect the data line DL and the first node N1, which is the gate electrode of the first transistor ST1, to each other. The second transistor ST2 may be turned on based on the gate signal to supply a data voltage to the first node N1. A gate electrode of the second transistor ST2 may be connected to the gate line GL, a drain electrode of the second transistor ST2 may be connected to the data line DL, and a source electrode of the second transistor ST2 may be connected to the first node N1. The source electrode of the second transistor ST2 may be connected to the gate electrode of the first transistor ST1 and a first capacitor electrode of the first capacitor C1 through the first node N1.

The third transistor ST3 may be turned on by a gate signal of the gate line GL to electrically connect the initialization voltage line VIL and the second node N2, which is the source electrode of the first transistor ST1, to each other. The third transistor ST3 may be turned on based on the gate signal to supply an initialization voltage to the second node N2. A gate electrode of the third transistor ST3 may be connected to the gate line GL, the drain electrode of the third transistor ST3 may be connected to the second node N2, and a source electrode of the third transistor ST3 may be connected to the initialization voltage line VIL. The drain electrode of the third transistor ST3 may be connected to the source electrode of the first transistor ST1, the second capacitor electrode of the first capacitor C1, and the first electrode of the first light emitting element ED1 through the second node N2.

Figure 5:
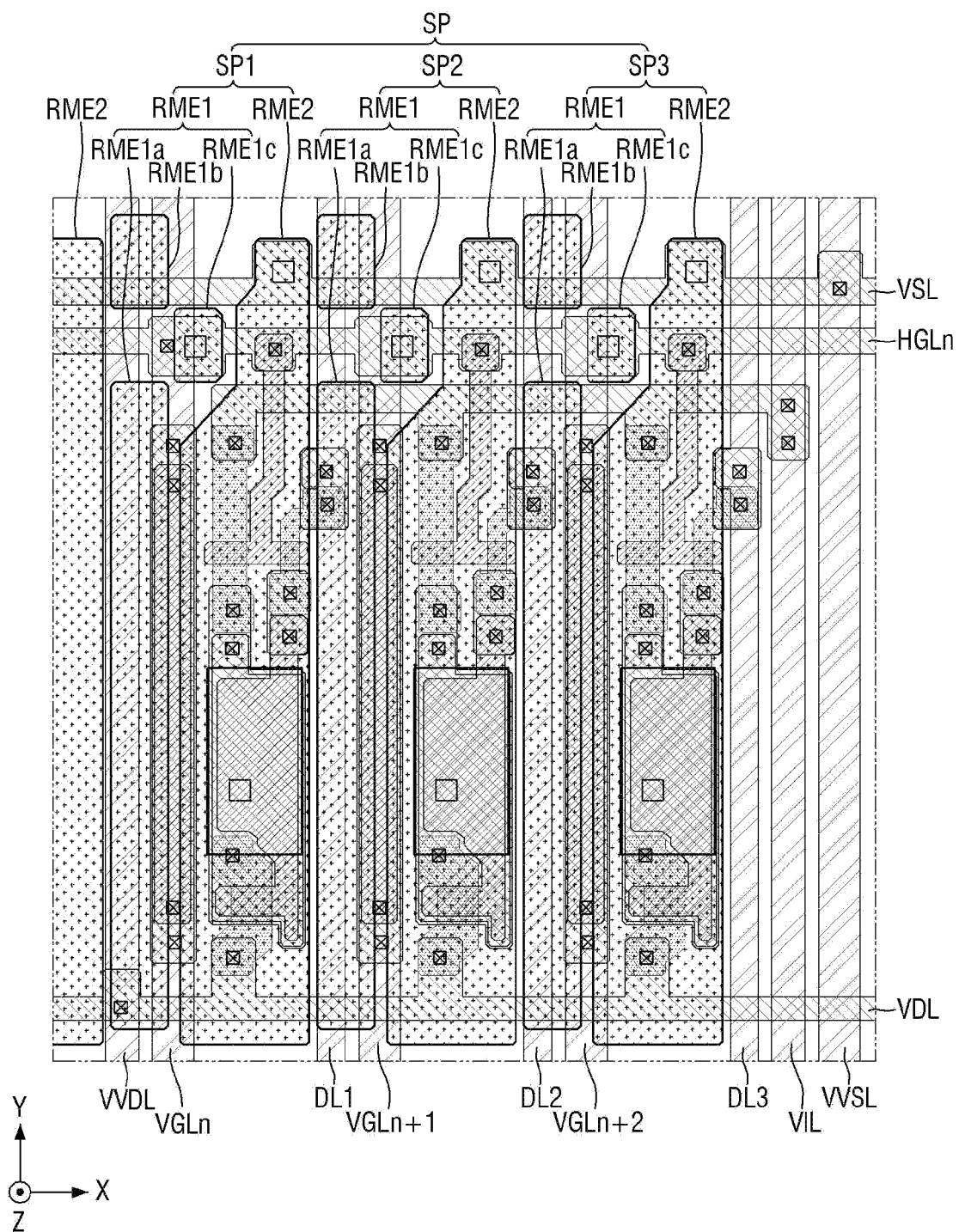
FIG. 5 is a schematic plan view illustrating a portion of a display area in the display device according to an embodiment.
Figure 6:
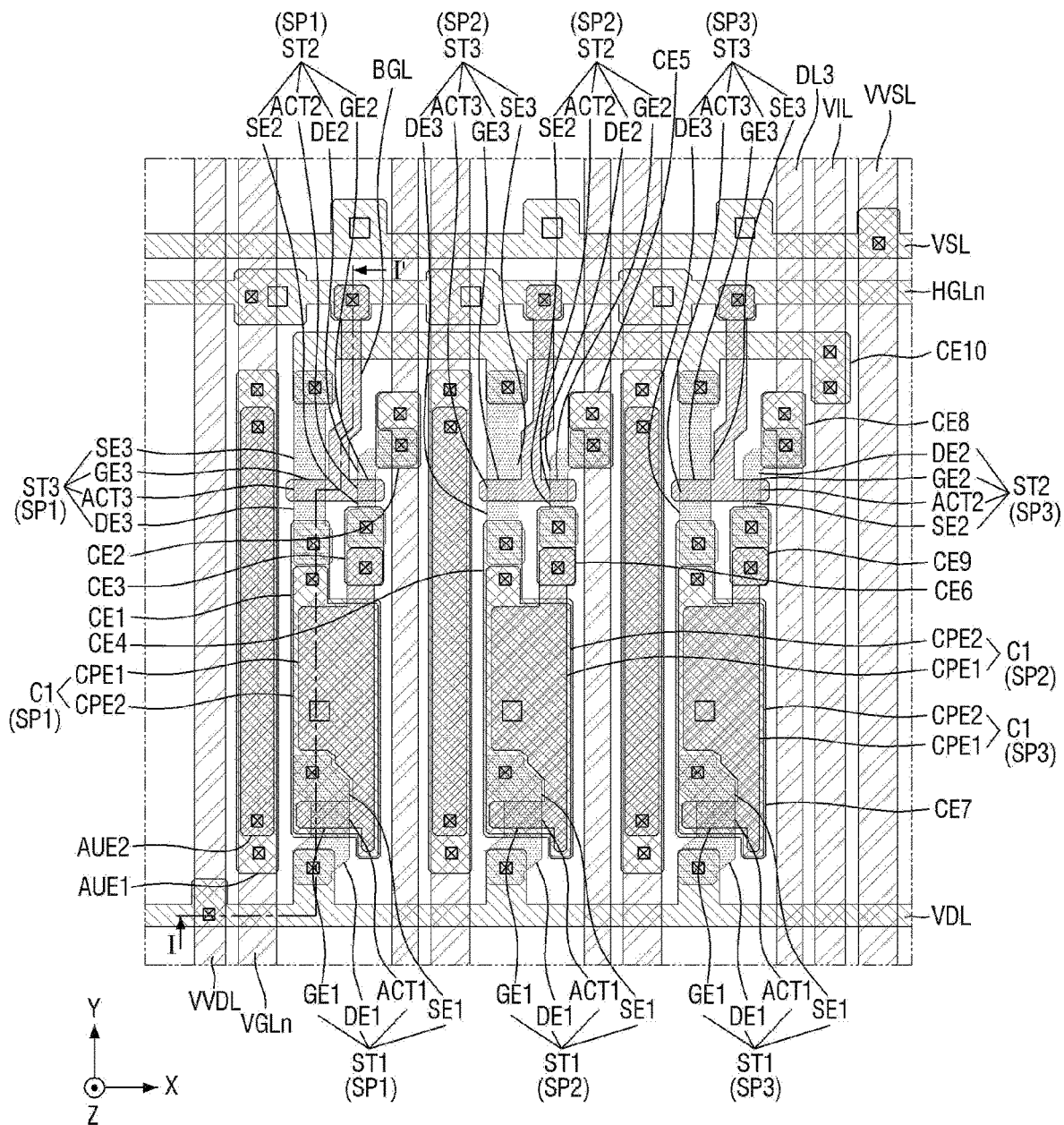
FIGS. 6 and 7 are schematic plan views illustrating a first metal layer, an active layer, a second metal layer, and a third metal layer in the display device of FIG. 5.
Figure 7:
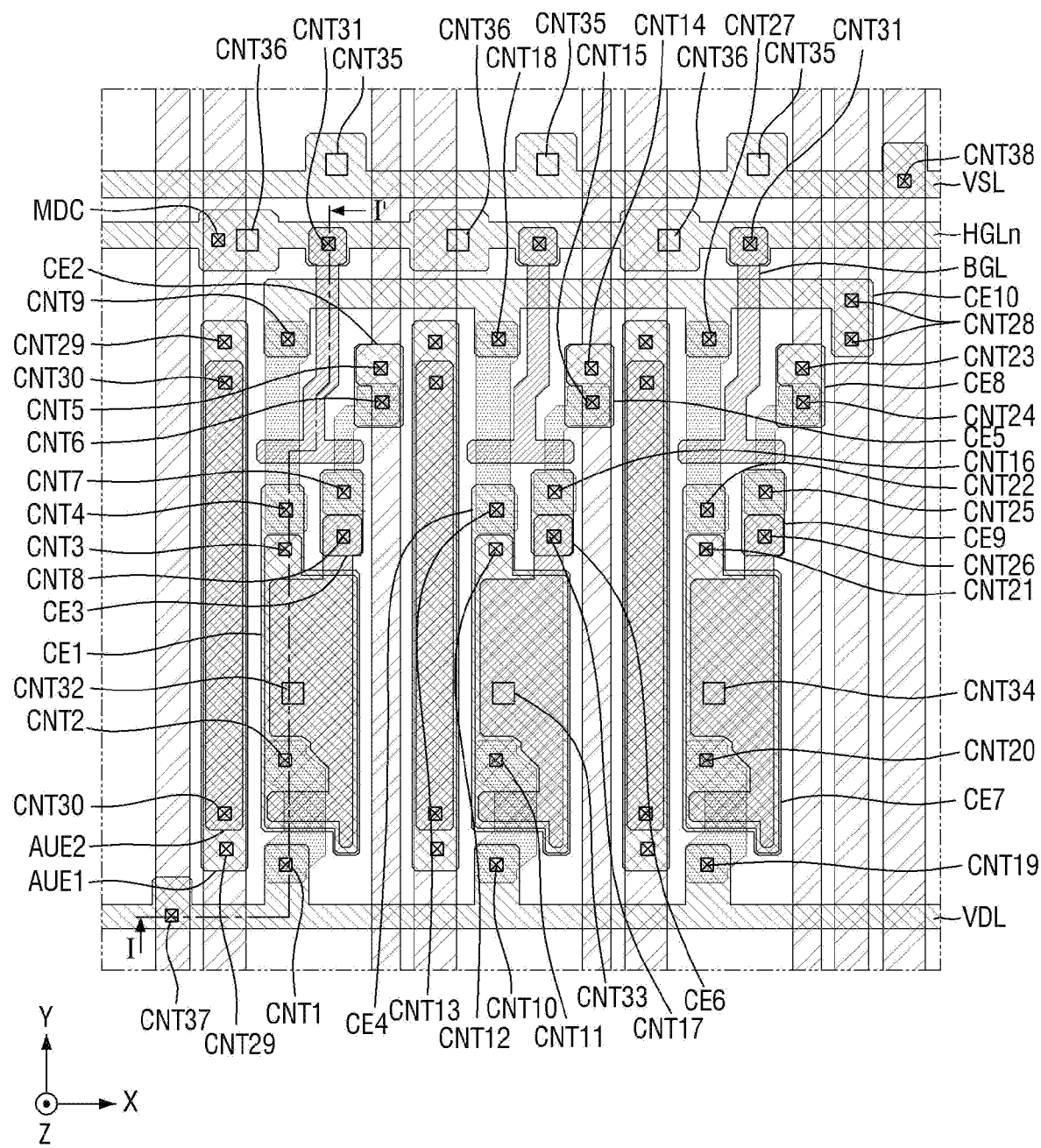
Figure 8:
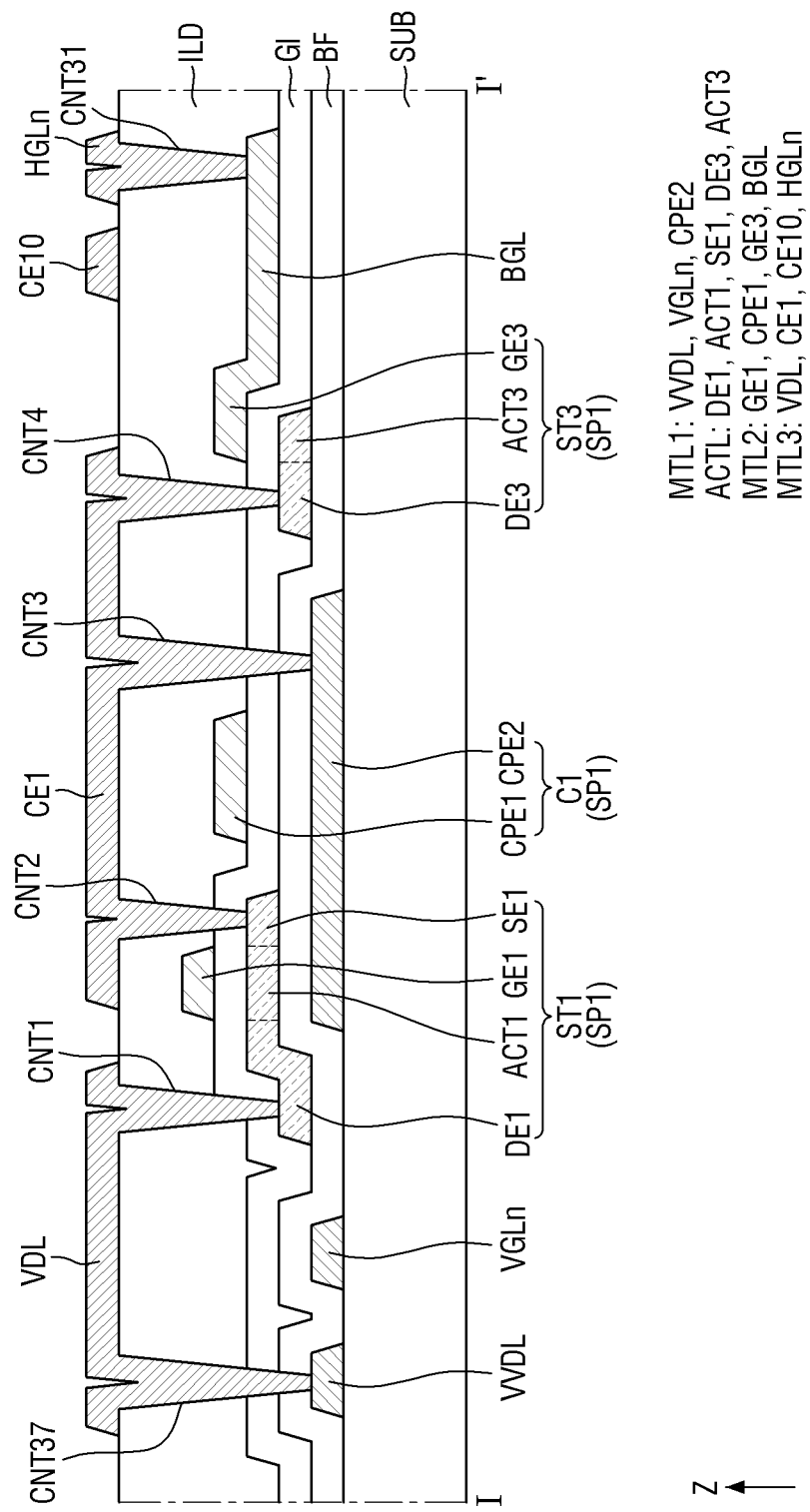
FIG. 8 is a schematic cross-sectional view taken along line I-I' of FIGS. 6 and 7.

FIG. 5 is a schematic plan view illustrating a portion of a display area in the display device according to an embodiment, FIGS. 6 and 7 are schematic plan views illustrating a first metal layer, an active layer, a second metal layer, and a third metal layer in the display device of FIG. 5, and FIG. 8 is a schematic cross-sectional view taken along line I-I' of FIGS. 6 and 7.

Referring to FIGS. 5 to 8, the display area DA may include pixels SP, gate lines GL, data lines DL, initialization voltage lines VIL, first voltage lines VDL, first vertical voltage lines VVDL, second vertical voltage lines VVSL, and second voltage lines VSL. The pixels SP may include first pixel SP1, second pixel SP2, and third pixel SP3. The gate line GL may include a vertical gate line VGL, a horizontal gate line HGL, and an auxiliary gate line BGL.

The vertical gate line VGL may be included in (or disposed in or disposed at) a first metal layer MTL1. The first metal layer MTL1 may be disposed on a substrate SUB. The vertical gate line VGL may be disposed on the left side of each of the first to third pixels SP1 to SP3. For example, the n-th vertical gate line VGLn may be disposed on the left side of the first pixel SP1, the n+1-th vertical gate line VGLn+1 may be disposed on the left side of the second pixel SP2, and the n+2-th vertical gate line VGLn+2 may be disposed on the left side of the third pixel SP3. The n-th vertical gate line VGLn may be connected to the n-th horizontal gate line HGLn through the contact part MDC, and may be insulated from the other horizontal gate lines HGL.

The vertical gate line VGL may overlap a first auxiliary electrode AUE1 of a third metal layer MTL3 in a thickness direction (Z-axis direction), and may be connected to the first auxiliary electrode AUE1 through a twenty ninth contact hole CNT29. The vertical gate line VGL may overlap a second auxiliary electrode AUE2 of a second metal layer MTL2 in the thickness direction (Z-axis direction), and may be connected to the second auxiliary electrode AUE2 through a thirtieth contact hole CNT30. Accordingly, the vertical gate line VGL may be connected to the first and second auxiliary electrodes AUE1 and AUE2 to decrease line resistance.

The horizontal gate line HGL may be included in the third metal layer MTL3. The third metal layer MTL3 may be disposed on an interlayer insulating film ILD covering the second metal layer MTL2. The horizontal gate lines HGL may be disposed on the upper side of the first to third pixels SP1 to SP3. The n-th horizontal gate line HGLn may be connected to the n-th vertical gate line VGLn through the contact part MDC. The n-th horizontal gate line HGLn may be connected to an auxiliary gate line BGL through a thirty first contact hole CNT31. The n-th horizontal gate line HGLn may supply the gate signal received from the n-th vertical gate line VGLn to the auxiliary gate line BGL.

The horizontal gate line HGL may be connected to first electrodes RME1 of each of the first to third pixels SP1 to SP3 through thirty sixth contact holes CNT36. In an alignment process of the light emitting elements ED, the vertical gate line VGL may supply an alignment signal to the horizontal gate line HGL, and the horizontal gate line HGL may supply the alignment signal to the first electrode RME1 of each of the first to third pixels SP1 to SP3. A third portion RME1$c$ of the first electrode RME1 connected to the horizontal gate line HGL may be separated from a first portion RME1$a$ and a second portion RME1$b$ of the first electrode RME1 after the alignment process of the light emitting elements ED is completed.

The auxiliary gate line BGL may be included in the second metal layer MTL2. The second metal layer MTL2 may be disposed on a gate insulating film GI covering an active layer ACTL. The auxiliary gate line BGL may extend in a direction opposite to the second direction (Y-axis direction) from the horizontal gate line HGL, and may be bent in each of the first direction (X-axis direction) and a direction opposite to the first direction (X-axis direction). The auxiliary gate lines BGL may supply the gate signals received from the horizontal gate lines HGL to the first to third pixels SP1 to SP3.

The first vertical voltage line VVDL may be included in the first metal layer MTL1. The first vertical voltage line VVDL may be disposed on the left side of the vertical gate line VGL disposed on the left side of the first pixel SP1. For example, the first vertical voltage line VVDL may be disposed on the left side of the n-th vertical gate line VGLn. The first vertical voltage line VVDL may be connected to the first voltage line VDL through a thirty seventh contact hole CNT37, and may supply a driving voltage or a high-potential voltage to the first voltage line VDL.

The first voltage line VDL may be included in the third metal layer MTL3. The first voltage line VDL may be disposed on the lower side of the first to third pixels SP1 to SP3. The first voltage line VDL may be connected to a drain electrode DE1 of a first transistor ST1 of the first pixel SP1 through a first contact hole CNT1, may be connected to a drain electrode DE1 of a first transistor ST1 of the second pixel SP2 through a tenth contact hole CNT10, and may be connected to a drain electrode DE1 of a first transistor ST1 of the third pixel SP3 through a nineteenth contact hole CNT19. Accordingly, the first voltage line VDL may supply a driving voltage to the first to third pixels SP1 to SP3.

The first data line DL1 may be included in the first metal layer MTL1. The first data line DL1 may be disposed on the right side of the first pixel SP1. The first data line DL1 may be disposed between the n-th vertical gate line VGLn and the n+1-th vertical gate line VGLn+1. The first data line DL1 may be connected to a second connection electrode CE2 of the third metal layer MTL3 through a fifth contact hole CNT5, and the second connection electrode CE2 may be connected to a drain electrode DE2 of a second transistor ST2 of the first pixel SP1 through a sixth contact hole CNT6. The first data line DL1 may supply a data voltage to the second transistor ST2 of the first pixel SP1.

The second data line DL2 may be included in the first metal layer MTL1. The second data line DL2 may be disposed on the right side of the second pixel SP2. The second data line DL2 may be disposed between the n+1-th vertical gate line VGLn+1 and the n+2-th vertical gate line VGLn+2. The second data line DL2 may be connected to a fifth connection electrode CE5 of the third metal layer MTL3 through a fourteenth contact hole CNT14, and the fifth connection electrode CE5 may be connected to a drain electrode DE2 of a second transistor ST2 of the second pixel SP2 through a fifteenth contact hole CNT15. The second data line DL2 may supply a data voltage to the second transistor ST2 of the second pixel SP2.

The third data line DL3 may be included in the first metal layer MTL1. The third data line DL3 may be disposed on the right side of the third pixel SP3. The third data line DL3 may be disposed between the n+2-th vertical gate line VGLn+2 and the initialization voltage line VIL. The third data line DL3 may be connected to an eighth connection electrode CE8 of the third metal layer MTL3 through a twenty third contact hole CNT23, and the eighth connection electrode CE8 may be connected to a drain electrode DE2 of a second transistor ST2 of the third pixel SP3 through a twenty fourth contact hole CNT24. The third data line DL3 may supply a data voltage to the second transistor ST2 of the third pixel SP3.

The initialization voltage line VIL may be included in the first metal layer MTL1. The initialization voltage line VIL may be disposed on the right side of the third data line DL3. The initialization voltage line VIL may be connected to a tenth connection electrode CE10 of the third metal layer MTL3 through twenty eighth contact holes CNT28. The tenth connection electrode CE10 may be connected to a source electrode SE3 of a third transistor ST3 of the first pixel SP1 through a ninth contact hole CNT9. The tenth connection electrode CE10 may be connected to a source electrode SE3 of a third transistor ST3 of the second pixel SP2 through an eighteenth contact hole CNT18. The tenth connection electrode CE10 may be connected to a source electrode SE3 of a third transistor ST3 of the third pixel SP3 through a twenty seventh contact hole CNT27. Accordingly, the initialization voltage line VIL may supply an initialization voltage to the third transistor ST3 of each of the first to third pixels SP1 to SP3, and may receive a sensed signal from the third transistor ST3.

The second vertical voltage line VVSL may be included in the first metal layer MTL1. The second vertical voltage line VVSL may be disposed on the right side of the initialization voltage line VIL. The second vertical voltage line VVSL may be connected to the second voltage line VSL of the third metal layer MTL3 through a thirty eighth contact hole CNT38. The second vertical voltage line VVSL may supply a low-potential voltage to the second voltage line VSL.

The second voltage line VSL may be included in the third metal layer MTL3. The second voltage line VSL may be disposed on the upper side of the horizontal gate line HGL. The second voltage line VSL may be connected to second electrodes RME2 of each of the first to third pixels SP1 to SP3 through thirty fifth contact holes CNT35. The second voltage line VSL may supply the low-potential voltage received from the second vertical voltage line VVSL to the second electrodes RME2 of each of the first to third pixels SP1 to SP3. Here, the second electrode RME2 of each of the first to third pixels SP1 to SP3 may be included in a fourth metal layer MTL4 (see, e.g., FIG. 13) on the third metal layer MTL3.

The pixel circuit of the first pixel SP1 may include first a transistor ST1, a second transistor ST2, a third transistor ST3, and a first capacitor C1. The first transistor ST1 of the first pixel SP1 may include an active region ACT1, a gate electrode GE1, the drain electrode DE1, and a source electrode SE1. The active region ACT1 of the first transistor ST1 may be included in the active layer ACTL, and may overlap the gate electrode GE1 of the first transistor ST1 in the thickness direction (Z-axis direction). The active layer ACTL may be disposed on a buffer layer BF covering the first metal layer MTL1.

The gate electrode GE1 of the first transistor ST1 may be included in the second metal layer MTL2. The gate electrode GE1 of the first transistor ST1 may be a portion of a first capacitor electrode CPE1 of the first capacitor C1. The first capacitor electrode CPE1 may be connected to a third connection electrode CE3 of the third metal layer MTL3 through an eighth contact hole CNT8, and the third connection electrode CE3 may be connected to a source electrode SE2 of the second transistor ST2 of the active layer ACTL through a seventh contact hole CNT7.

The drain electrode DE1 and the source electrode SE1 of the first transistor ST1 may be provided by heat-treating the active layer ACTL to make the active layer ACTL conductors. The drain electrode DE1 of the first transistor ST1 may be connected to the first voltage line VDL of the third metal layer MTL3 through the first contact hole CNT1. The drain electrode DE1 of the first transistor ST1 may receive the driving voltage from the first voltage line VDL.

The source electrode SE1 of the first transistor ST1 may be connected to a first connection electrode CE1 of the third metal layer MTL3 through a second contact hole CNT2. The first connection electrode CE1 may be connected to a second capacitor electrode CPE2 of the first metal layer MTL1 through a third contact hole CNT3. Accordingly, the first capacitor C1 may be doubly formed between the first capacitor electrode CPE1 and the second capacitor electrode CPE2 and between the first capacitor electrode CPE1 and the first connection electrode CE1.

The second transistor ST2 of the first pixel SP1 may include an active region ACT2, the gate electrode GE2, the drain electrode DE2, and the source electrode SE2. The active region ACT2 of the second transistor ST2 may be included in the active layer ACTL, and may overlap the gate electrode GE2 of the second transistor ST2 in the thickness direction (Z-axis direction).

The gate electrode GE2 of the second transistor ST2 may be included in the second metal layer MTL2. The gate electrode GE2 of the second transistor ST2 may be a portion of the auxiliary gate line BGL.

The drain electrode DE2 and the source electrode SE2 of the second transistor ST2 may be provided by heat-treating the active layer ACTL to make the active layer ACTL conductors. The drain electrode DE2 of the second transistor ST2 may be connected to the second connection electrode CE2 of the third metal layer MTL3 through the sixth contact hole CNT6, and the second connection electrode CE2 may be connected to the first data line DL1 through the fifth contact hole CNT5. The drain electrode DE2 of the second transistor ST2 may receive the data voltage of the first pixel SP1 from the first data line DL1.

The source electrode SE2 of the second transistor ST2 may be connected to the third connection electrode CE3 of the third metal layer MTL3 through the seventh contact hole CNT7, and the third connection electrode CE3 may be connected to the first capacitor electrode CPE1 through the eighth contact hole CNT8.

The third transistor ST3 of the first pixel SP1 may include an active region ACT3, a gate electrode GE3, a drain electrode DE3, and the source electrode SE3. The active region ACT3 of the third transistor ST3 may be included in the active layer ACTL, and may overlap the gate electrode GE3 of the third transistor ST3 in the thickness direction (Z-axis direction).

The gate electrode GE3 of the third transistor ST3 may be included in the second metal layer MTL2. The gate electrode GE3 of the third transistor ST3 may be a portion of the auxiliary gate line BGL.

The drain electrode DE3 and the source electrode SE3 of the third transistor ST3 may be provided by heat-treating the active layer ACTL to make the active layer ACTL conductors. The drain electrode DE3 of the third transistor ST3 may be connected to the first connection electrode CE1 of the third metal layer MTL3 through a fourth contact hole CNT4. The first connection electrode CE1 may be connected to a first contact electrode of the first pixel SP1 through a thirty second contact hole CNT32. Here, the first contact electrode of the first pixel SP1 may be included in a fifth metal layer MTL5 (see, e.g., FIG. 13) on the fourth metal layer MTL4.

The source electrode SE3 of the third transistor ST3 may be connected to the tenth connection electrode CE10 of the third metal layer MTL3 through the ninth contact hole CNT9, and the tenth connection electrode CE10 may be connected to the initialization voltage line VIL through the twenty eighth contact holes CNT28. The source electrode SE3 of the third transistor ST3 may receive the initialization voltage from the initialization voltage line VIL. The source electrode SE3 of the third transistor ST3 may supply the sensed signal to the initialization voltage line VIL.

The pixel circuit of the second pixel SP2 may include a first transistor ST1, a second transistor ST2, a third transistor ST3, and a first capacitor C1. The first transistor ST1 of the second pixel SP2 may include an active region ACT1, a gate electrode GE1, the drain electrode DE1, and a source electrode SE1. The active region ACT1 of the first transistor ST1 may be included in the active layer ACTL, and may overlap the gate electrode GE1 of the first transistor ST1 in the thickness direction (Z-axis direction).

The gate electrode GE1 of the first transistor ST1 may be included in the second metal layer MTL2. The gate electrode GE1 of the first transistor ST1 may be a portion of a first capacitor electrode CPE1 of the first capacitor C1. The first capacitor electrode CPE1 may be connected to a sixth connection electrode CE6 through a seventeenth contact hole CNT17, and the sixth connection electrode CE6 may be connected to a source electrode SE2 of the second transistor ST2 of the active layer ACTL through a sixteenth contact hole CNT16.

The drain electrode DE1 and the source electrode SE1 of the first transistor ST1 may be provided by heat-treating the active layer ACTL to make the active layer ACTL conductors. The drain electrode DE1 of the first transistor ST1 may be connected to the first voltage line VDL of the third metal layer MTL3 through the tenth contact hole CNT10. The drain electrode DE1 of the first transistor ST1 may receive the driving voltage from the first voltage line VDL.

The source electrode SE1 of the first transistor ST1 may be connected to a fourth connection electrode CE4 of the third metal layer MTL3 through an eleventh contact hole CNT11. The fourth connection electrode CE4 may be connected to a second capacitor electrode CPE2 of the first metal layer MTL1 through a twelfth contact hole CNT12. Accordingly, the first capacitor C1 may be doubly formed between the first capacitor electrode CPE1 and the second capacitor electrode CPE2 and between the first capacitor electrode CPE1 and the fourth connection electrode CE4.

The second transistor ST2 of the second pixel SP2 may include an active region ACT2, a gate electrode GE2, the drain electrode DE2, and the source electrode SE2. The active region ACT2 of the second transistor ST2 may be included in the active layer ACTL, and may overlap the gate electrode GE2 of the second transistor ST2 in the thickness direction (Z-axis direction).

The gate electrode GE2 of the second transistor ST2 may be included in the second metal layer MTL2. The gate electrode GE2 of the second transistor ST2 may be a portion of the auxiliary gate line BGL.

The drain electrode DE2 and the source electrode SE2 of the second transistor ST2 may be provided by heat-treating the active layer ACTL to make the active layer ACTL conductors. The drain electrode DE2 of the second transistor ST2 may be connected to the fifth connection electrode CE5 of the third metal layer MTL3 through the fifteenth contact hole CNT15, and the fifth connection electrode CE5 may be connected to the second data line DL2 through the fourteenth contact hole CNT14. The drain electrode DE2 of the second transistor ST2 may receive the data voltage of the second pixel SP2 from the second data line DL2.

The source electrode SE2 of the second transistor ST2 may be connected to the sixth connection electrode CE6 of the third metal layer MTL3 through the sixteenth contact hole CNT16, and the sixth connection electrode CE6 may be connected to the first capacitor electrode CPE1 through the seventeenth contact hole CNT17.

The third transistor ST3 of the second pixel SP2 may include an active region ACT3, a gate electrode GE3, the drain electrode DE3, and the source electrode SE3. The active region ACT3 of the third transistor ST3 may be included in the active layer ACTL, and may overlap the gate electrode GE3 of the third transistor ST3 in the thickness direction (Z-axis direction).

The gate electrode GE3 of the third transistor ST3 may be included in the second metal layer MTL2. The gate electrode GE3 of the third transistor ST3 may be a portion of the auxiliary gate line BGL.

The drain electrode DE3 and the source electrode SE3 of the third transistor ST3 may be provided by heat-treating the active layer ACTL to make the active layer ACTL conductors. The drain electrode DE3 of the third transistor ST3 may be connected to the fourth connection electrode CE4 of the third metal layer MTL3 through a thirteenth contact hole CNT13. The fourth connection electrode CE4 may be connected to a first contact electrode of the second pixel SP2 through a thirty third contact hole CNT33. Here, the first contact electrode of the second pixel SP2 may be included in the fifth metal layer MTL5.

The source electrode SE3 of the third transistor ST3 may be connected to the tenth connection electrode CE10 of the third metal layer MTL3 through the eighteenth contact hole CNT18, and the tenth connection electrode CE10 may be connected to the initialization voltage line VIL through the twenty eighth contact holes CNT28. The source electrode SE3 of the third transistor ST3 may receive the initialization voltage from the initialization voltage line VIL. The source electrode SE3 of the third transistor ST3 may supply the sensed signal to the initialization voltage line VIL.

The pixel circuit of the third pixel SP3 may include a first transistor ST1, a second transistor ST2, a third transistor ST3, and a first capacitor C1. The first transistor ST1 of the third pixel SP3 may include an active region ACT1, a gate electrode GE1, the drain electrode DE1, and a source electrode SE1. The active region ACT1 of the first transistor ST1 may be included in the active layer ACTL, and may overlap the gate electrode GE1 of the first transistor ST1 in the thickness direction (Z-axis direction).

The gate electrode GE1 of the first transistor ST1 may be included in the second metal layer MTL2. The gate electrode GE1 of the first transistor ST1 may be a portion of a first capacitor electrode CPE1 of the first capacitor C1. The first capacitor electrode CPE1 may be connected to a ninth connection electrode CE9 through a twenty sixth contact hole CNT26, and the ninth connection electrode CE9 may be connected to a source electrode SE2 of the second transistor ST2 of the active layer ACTL through a twenty fifth contact hole CNT25.

The drain electrode DE1 and the source electrode SE1 of the first transistor ST1 may be provided by heat-treating the active layer ACTL to make the active layer ACTL conductors. The drain electrode DE1 of the first transistor ST1 may be connected to the first voltage line VDL of the third metal layer MTL3 through the nineteenth contact hole CNT19. The drain electrode DE1 of the first transistor ST1 may receive the driving voltage from the first voltage line VDL.

The source electrode SE1 of the first transistor ST1 may be connected to a seventh connection electrode CE7 of the third metal layer MTL3 through a twentieth contact hole CNT20. The seventh connection electrode CE7 may be connected to a second capacitor electrode CPE2 of the first metal layer MTL1 through a twenty first contact hole CNT21. Accordingly, the first capacitor C1 may be doubly formed between the first capacitor electrode CPE1 and the second capacitor electrode CPE2 and between the first capacitor electrode CPE1 and the seventh connection electrode CE7.

The second transistor ST2 of the third pixel SP2 may include an active region ACT2, a gate electrode GE2, the drain electrode DE2, and the source electrode SE2. The active region ACT2 of the second transistor ST2 may be included in the active layer ACTL, and may overlap the gate electrode GE2 of the second transistor ST2 in the thickness direction (Z-axis direction).

The gate electrode GE2 of the second transistor ST2 may be included in the second metal layer MTL2. The gate electrode GE2 of the second transistor ST2 may be a portion of the auxiliary gate line BGL.

The drain electrode DE2 and the source electrode SE2 of the second transistor ST2 may be provided by heat-treating the active layer ACTL to make the active layer ACTL conductors. The drain electrode DE2 of the second transistor ST2 may be connected to the eighth connection electrode CE8 of the third metal layer MTL3 through the twenty fourth contact hole CNT24, and the eighth connection electrode CE8 may be connected to the third data line DL3 through the twenty third contact hole CNT23. The drain electrode DE2 of the second transistor ST2 may receive the data voltage of the third pixel SP3 from the third data line DL3.

The source electrode SE2 of the second transistor ST2 may be connected to the ninth connection electrode CE9 of the third metal layer MTL3 through the twenty fifth contact hole CNT25, and the ninth connection electrode CE9 may be connected to the first capacitor electrode CPE1 through the twenty sixth contact hole CNT26.

The third transistor ST3 of the third pixel SP3 may include an active region ACT3, a gate electrode GE3, a drain electrode DE3, and the source electrode SE3. The active region ACT3 of the third transistor ST3 may be included in the active layer ACTL, and may overlap the gate electrode GE3 of the third transistor ST3 in the thickness direction (Z-axis direction).

The gate electrode GE3 of the third transistor ST3 may be included in the second metal layer MTL2. The gate electrode GE3 of the third transistor ST3 may be a portion of the auxiliary gate line BGL.

The drain electrode DE3 and the source electrode SE3 of the third transistor ST3 may be provided by heat-treating the active layer ACTL to make the active layer ACTL conductors. The drain electrode DE3 of the third transistor ST3 may be connected to the seventh connection electrode CE7 of the third metal layer MTL3 through a twenty second contact hole CNT22. The seventh connection electrode CE7 may be connected to a first contact electrode of the third pixel SP3 through a thirty fourth contact hole CNT34. Here, the first contact electrode of the third pixel SP3 may be included in the fifth metal layer MTL5.

The source electrode SE3 of the third transistor ST3 may be connected to the tenth connection electrode CE10 of the third metal layer MTL3 through the twenty seventh contact hole CNT27, and the tenth connection electrode CE10 may be connected to the initialization voltage line VIL through the twenty eighth contact holes CNT28. The source electrode SE3 of the third transistor ST3 may receive the initialization voltage from the initialization voltage line VIL. The source electrode SE3 of the third transistor ST3 may supply the sensed signal to the initialization voltage line VIL.

The first electrode RME1 of each of the first to third pixels SP1 to SP3 may be included in the fourth metal layer MTL4. The first electrode RME1 may be separated into first portion RME1a, second portion RME1b, and third portions RME1c after the alignment process of the light emitting elements ED is completed. The first portion RME1a of the first electrode RME1 may extend in the second direction (Y-axis direction), and the first portion RME1a and the second portion RME1b of the first electrode RME1 may be spaced apart from each other in the second direction (Y-axis direction). The first portion RME1a and the second portion RME1b of the first electrode RME1 may be spaced apart from each other with the n-th horizontal gate line HGLn interposed therebetween. The third portion RME1c of the first electrode RME1 may overlap the n-th horizontal gate line HGLn. The third portion RME1c of the first electrode RME1 may be spaced apart from the first portion RME1a in a diagonal direction between the first direction (X-axis direction) and the second direction (Y-axis direction).

The first portion RME1a and the second portion RME1b of the first electrode RME1 of the first pixel SP1 may overlap the first vertical voltage line VVDL and the n-th vertical gate line VGLn. The first portion RME1a and the second portion RME1b of the first electrode RME1 of the second pixel SP2 may overlap the first data line DL1 and the n+1-th vertical gate line VGLn+1. The first portion RME1a and the second portion RME1b of the first electrode RME1 of the third pixel SP3 may overlap the second data line DL2 and the n+2-th vertical gate line VGLn+2. Accordingly, the first electrodes RME1 of each of the first to third pixels SP1 to SP3 may have a same overlapping structure. The first electrodes RME1 of each of the first to third pixels SP1 to SP3 may overlap the n-th, n+1-th, and n+2-th vertical gate lines VGLn, VGLn+1, and VGLn+2 to form an equal potential.

The second electrode RME2 of each of the first to third pixels SP1 to SP3 may be included in the fourth metal layer MTL4. The second electrode RME2 may extend in the second direction (Y-axis direction), and may be disposed between the first electrodes RME1. The second electrode RME2 of the first pixel SP1 may overlap the pixel circuit of the first pixel SP1. The second electrode RME2 of the first pixel SP1 may overlap the first to third transistors ST1 to ST3 and the first capacitor C1 of the first pixel SP1. The second electrode RME2 of the second pixel SP2 may overlap the pixel circuit of the second pixel SP2. The second electrode RME2 of the third pixel SP3 may overlap the pixel circuit of the third pixel SP3. Accordingly, the second electrodes RME2 of each of the first to third pixels SP1 to SP3 may have a same overlapping structure. The second electrodes RME2 of each of the first to third pixels SP1 to SP3 may overlap the pixel circuits of the first to third pixels SP1 to SP3 to form an equal potential.

Figure 9:
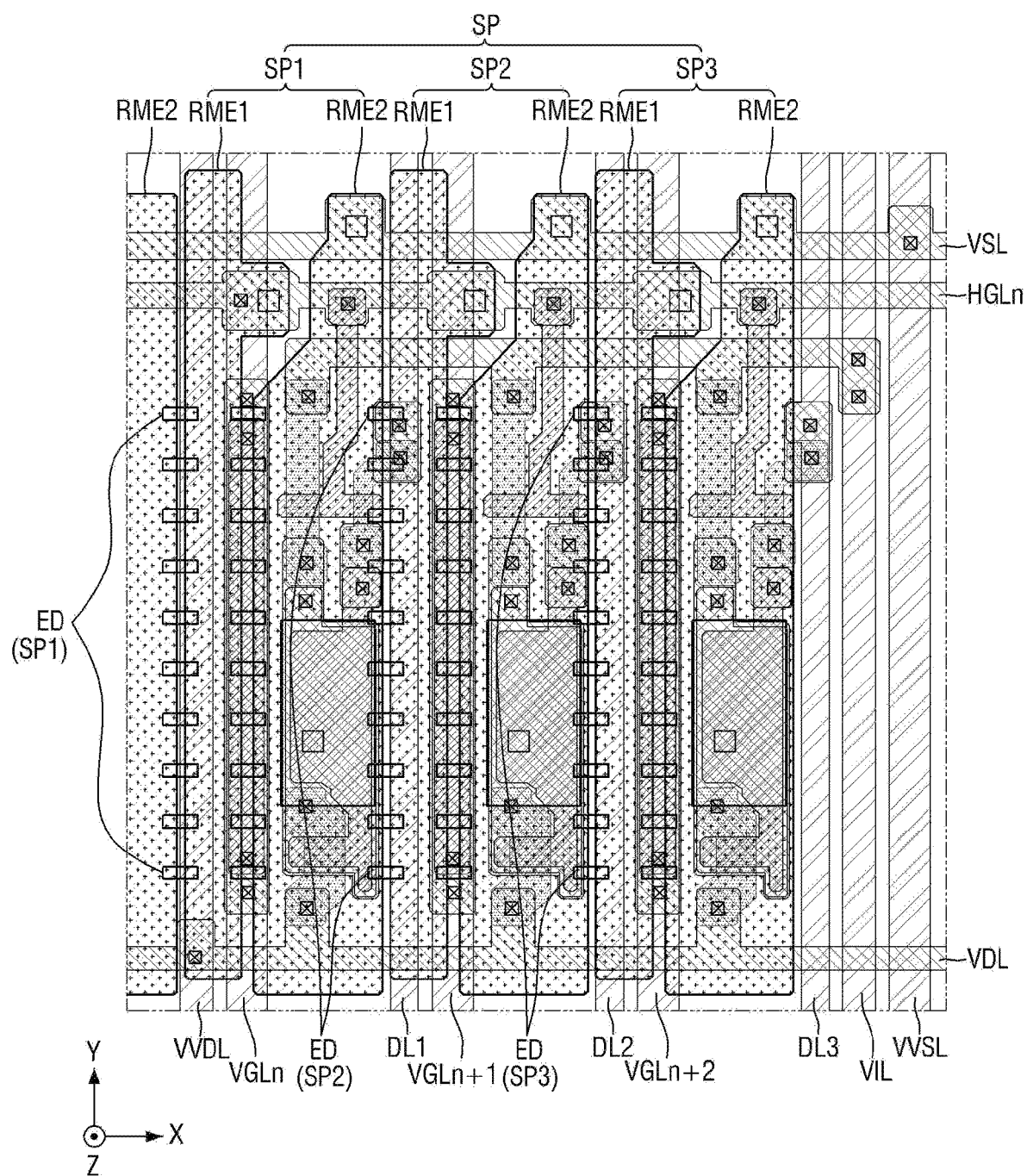
FIG. 9 is a schematic plan view illustrating an alignment process of light emitting elements in the display device according to an embodiment.
Figure 10:
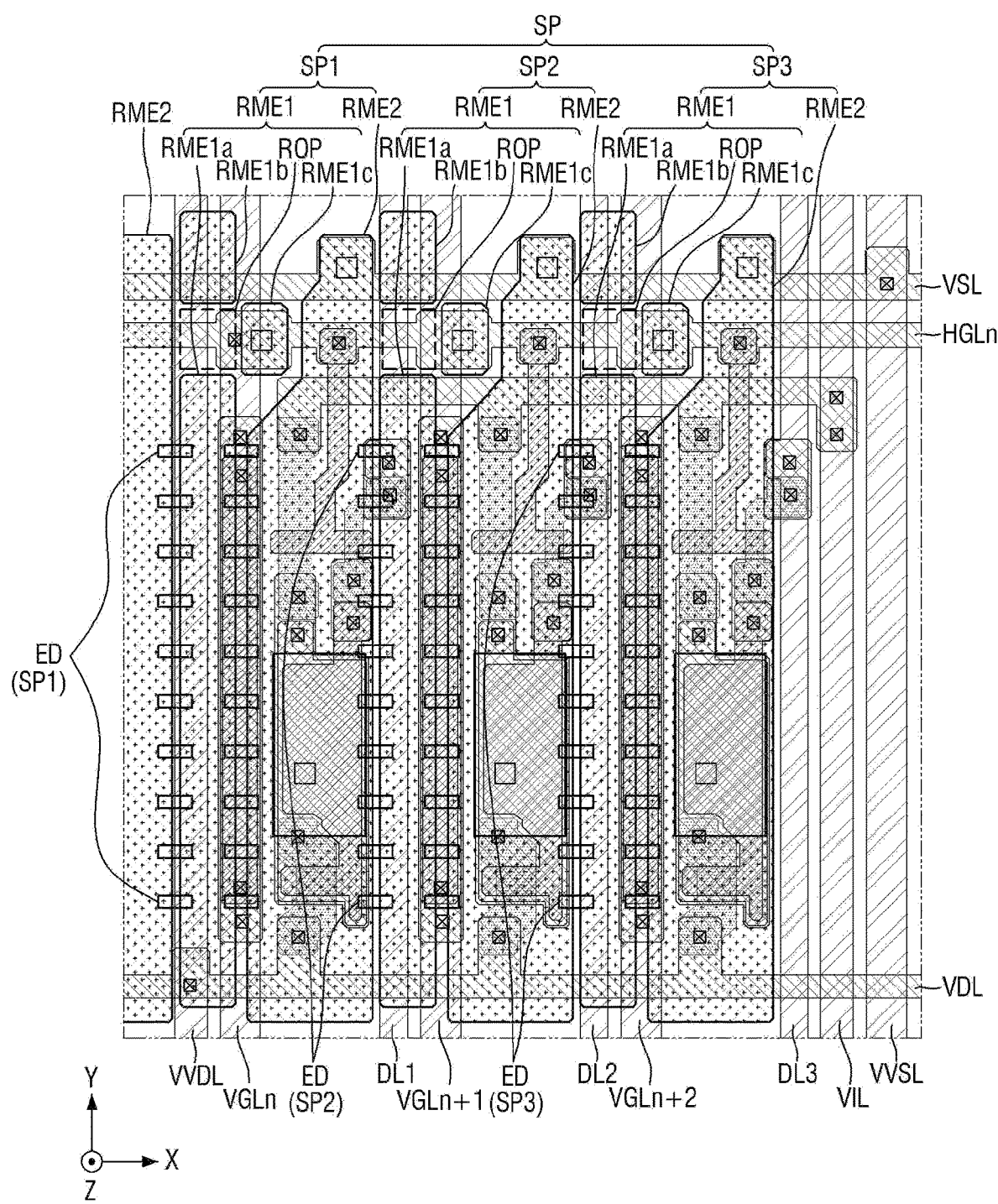
FIG. 10 is a schematic plan view illustrating separation parts in the display device according to an embodiment.

FIG. 9 is a schematic plan view illustrating an alignment process of light emitting elements in the display device according to an embodiment, and FIG. 10 is a schematic plan view illustrating separation parts in the display device according to an embodiment.

Referring to FIGS. 9 and 10, the first electrode RME1 of each of the first to third pixels SP1 to SP3 may be included in the fourth metal layer MTL4. The first electrode RME1 may receive the alignment signal through the vertical gate line VGL and the horizontal gate line HGL in the alignment process of the light emitting elements ED. The second electrode RME2 may receive the low-potential voltage from the second voltage line VSL. The first electrodes RME1 and the second electrodes RME2 may extend in the second direction (Y-axis direction), and may be alternately disposed in the first direction (X-axis direction). The first electrode RME1 receives the alignment signal and the second electrode RME2 receives the low-potential voltage, such that an electric field may be formed between the first and second electrodes RME1 and RME2. For example, the light emitting elements ED may be jetted onto the first and second electrodes RME1 and RME2 through an inkjet printing process, and the light emitting elements ED dispersed in ink may be aligned by receiving a dielectrophoresis force by the electric field formed between the first and second electrodes RME1 and RME2.

The light emitting elements ED of the first pixel SP1 may be aligned between the first electrode RME1 of the first pixel SP1 and the second electrode RME2 on a left side of the first electrode RME1, and may be aligned between the first electrode RME1 of the first pixel SP1 and the second electrode RME2 of the first pixel SP1. The light emitting elements ED of the second pixel SP2 may be aligned between the first electrode RME1 of the second pixel SP2 and the second electrode RME2 of the first pixel SP1, and may be aligned between the first electrode RME1 of the second pixel SP2 and the second electrode RME2 of the second pixel SP2. The light emitting elements ED of the third pixel SP3 may be aligned between the first electrode RME1 of the third pixel SP3 and the second electrode RME2 of the second pixel SP2, and may be aligned between the first electrode RME1 of the third pixel SP3 and the second electrode RME2 of the third pixel SP3.

The first electrode RME1 of the first pixel SP1 may overlap the first vertical voltage line VVDL and the n-th vertical gate line VGLn. The first electrode RME1 of the second pixel SP2 may overlap the first data line DL1 and the n+1-th vertical gate line VGLn+1. The first electrode RME1 of the third pixel SP3 may overlap the second data line DL2 and the n+2-th vertical gate line VGLn+2. Accordingly, the first electrodes RME1 of each of the first to third pixels SP1 to SP3 may have the same overlapping structure.

The second electrode RME2 of each of the first to third pixels SP1 to SP3 may be included in the fourth metal layer MTL4. The second electrode RME2 may extend in the second direction (Y-axis direction), and may be disposed between the first electrodes RME1. The second electrode RME2 of the first pixel SP1 may overlap the pixel circuit of the first pixel SP1. The second electrode RME2 of the first pixel SP1 may overlap the first to third transistors ST1 to ST3 and the first capacitor C1 of the first pixel SP1. The second electrode RME2 of the second pixel SP2 may overlap the pixel circuit of the second pixel SP2. The second electrode RME2 of the third pixel SP3 may overlap the pixel circuit of the third pixel SP3. Accordingly, the second electrodes RME2 of each of the first to third pixels SP1 to SP3 may have the same overlapping structure.

The first electrodes RME1 of each of the first to third pixels SP1 to SP3 have the same overlapping structure, and the second electrodes RME2 of each of the first to third pixels SP1 to SP3 have the same overlapping structure, such that a deviation between the alignment signals may be minimized in an alignment process of the light emitting elements ED of the first to third pixels SP1 to SP3. Accordingly, in the first to third pixels SP1 to SP3, reliability of the alignment process may be improved, and a misalignment problem of the light emitting elements ED may be solved.

The first electrode RME1 of each of the first to third pixels SP1 to SP3 may be separated into the first portion RME1a, the second portion RME1b, and the third portion RME1c by a separation part ROP. The first connection electrode CE1 of the first pixel SP1 may be directly connected to the first contact electrode of the fifth metal layer MTL5, such that the first electrode RME1 may not be connected to the first connection electrode CE1. An alignment area of the light emitting elements ED and the separation part ROP may be spaced apart from each other. Accordingly, the first pixel SP1 does not require a process of separating the first electrode RME1 and the first connection electrode CE1, and may secure the alignment area of the light emitting elements ED as large as possible. The second pixel SP2 and the third pixel SP3 may also secure the alignment areas as large as possible through a same principle. The first to third pixels SP1 to SP3 may include a greater number of light emitting elements ED by aligning the light emitting elements ED from a lower side of the horizontal gate line HGL to the first voltage line VDL in a plan view. The display device 10 may improve luminous efficiency of the display panel 100 by securing the alignment areas of the light emitting elements ED as large as possible.

Figure 11:
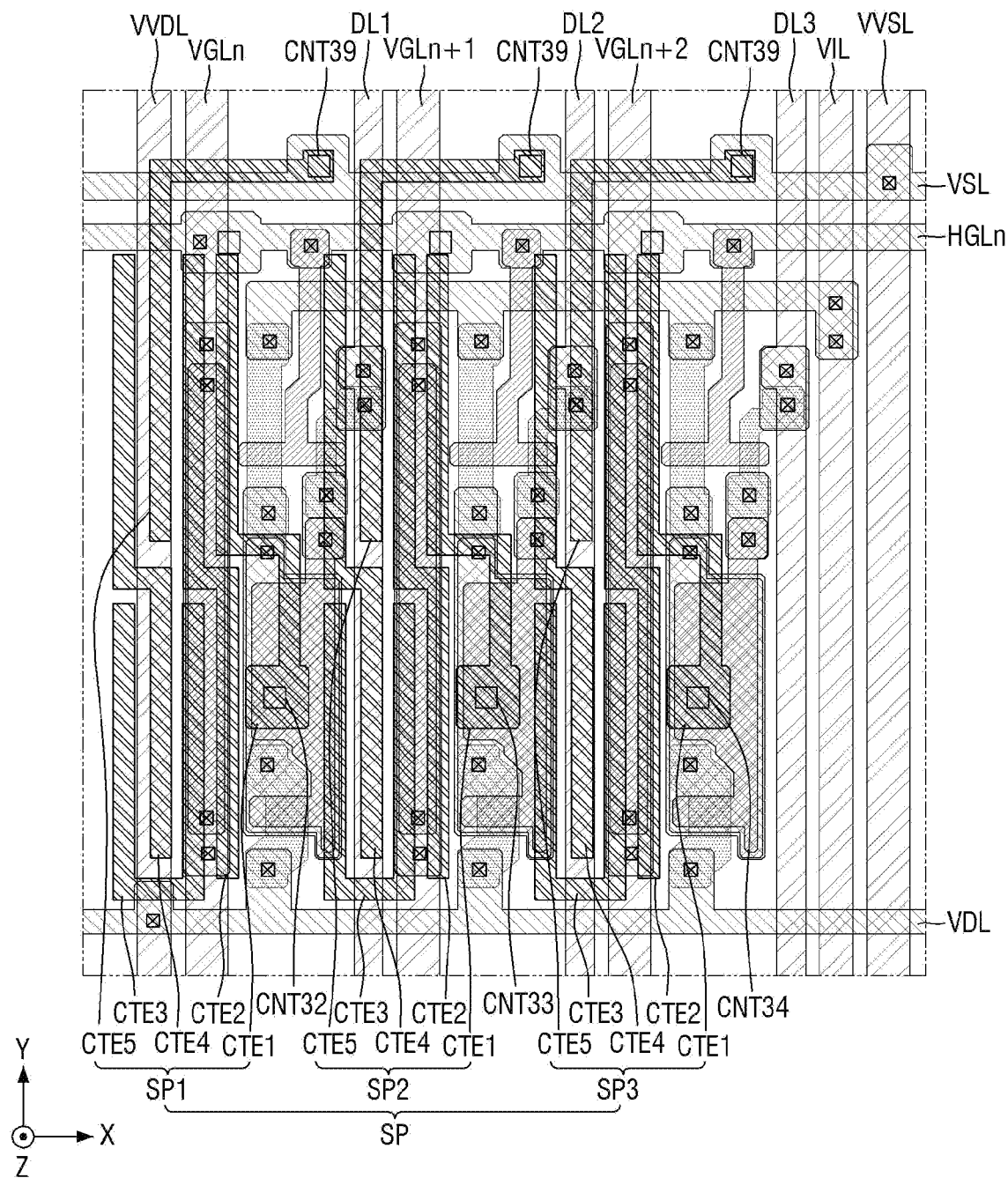
FIG. 11 is a schematic plan view in which a fifth metal layer is added in the display device of FIGS. 6 and 7.
Figure 12:
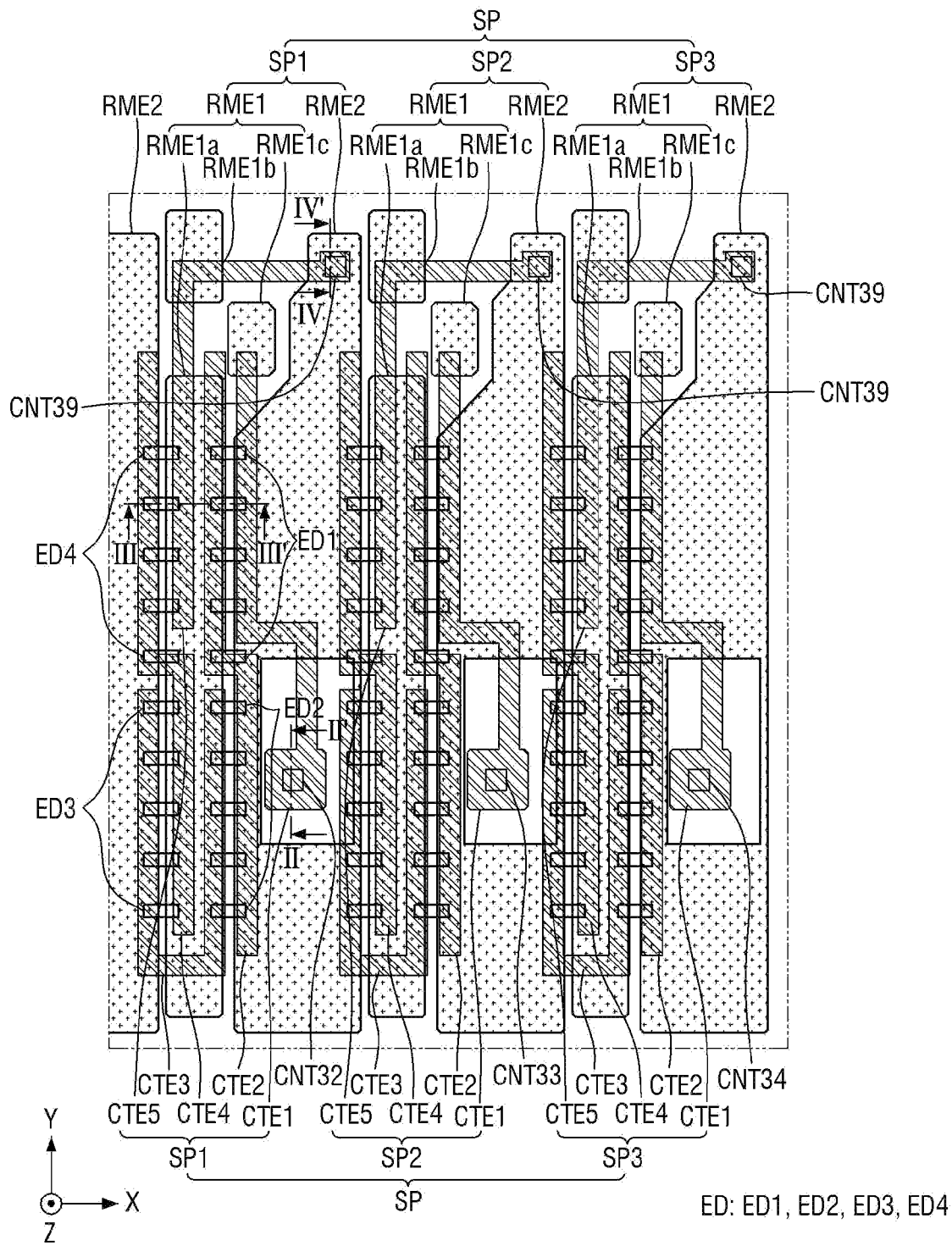
FIG. 12 is a schematic plan view illustrating a fourth metal layer, light emitting elements, and a fifth metal layer in the display device according to an embodiment.
Figure 13:
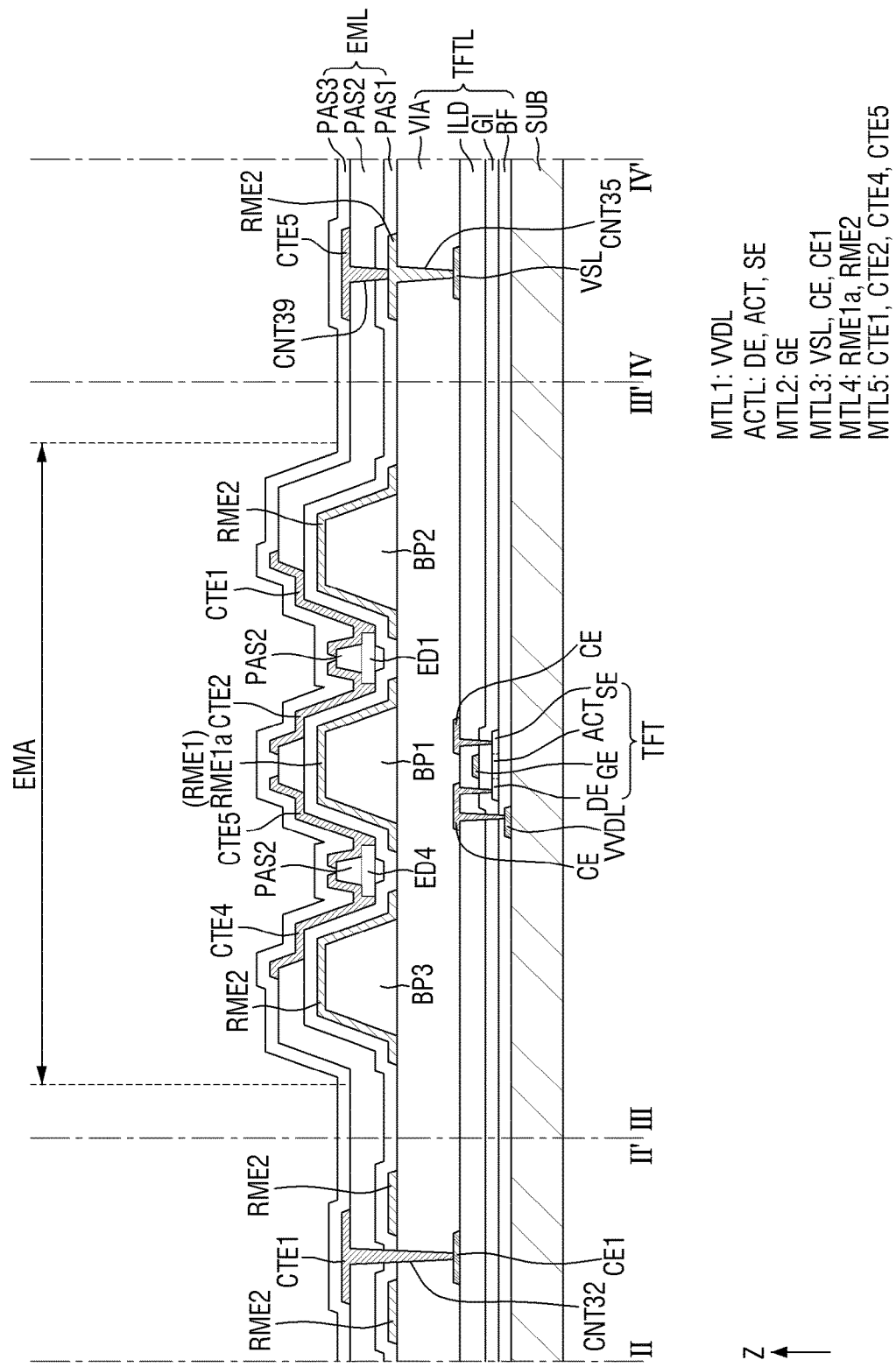
FIG. 13 is a schematic cross-sectional view taken along lines and IV-IV' of FIG. 12.

FIG. 11 is a schematic plan view in which a fifth metal layer is added in the display device of FIGS. 6 and 7, FIG. 12 is a schematic plan view illustrating a fourth metal layer, light emitting elements, and a fifth metal layer in the display device according to an embodiment, and FIG. 13 is a schematic cross-sectional view taken along lines II-II' III-III' and IV-IV' of FIG. 12.

Referring to FIGS. 11 to 13, a light emitting element layer EML of the display device 10 may be disposed on a thin film transistor layer TFTL. The light emitting element layer EML may include first bank pattern BP1, second bank pattern BP2, third bank pattern BP3, first electrodes RME1, second electrodes RME2, first light emitting elements ED1, second light emitting elements ED2, third light emitting elements ED3, fourth light emitting elements ED4, a first insulating film PAS1, a second insulating film PAS2, first contact electrodes CTE1, second contact electrodes CTE2, third contact electrodes CTE3, fourth contact electrodes CTE4, fifth contact electrodes CTE5, and a third insulating film PASS.

The first bank pattern BP1 may be disposed at a center of an emission area EMA, the second bank pattern BP2 may be disposed on a right side of the emission area EMA, and the third bank pattern BP3 may be disposed on a left side of the emission area EMA. Each of the first to third bank patterns BP1 to BP3 may protrude in an upward direction (Z-axis direction) on a via layer VIA. Each of the first to third bank patterns BP1 to BP3 may have inclined side surfaces. The first light emitting elements ED1 and the second light emitting elements ED2 may be disposed between the first bank pattern BP1 and the second bank pattern BP2 spaced apart from each other, and the third light emitting elements ED3 and the fourth light emitting elements ED4 may be disposed between the first bank pattern BP1 and the third bank pattern BP3 spaced apart from each other. The first to third bank patterns BP1 to BP3 may have a same length in the second direction (Y-axis direction) and have different lengths in the first direction (X-axis direction), but are not limited thereto. The first to third bank patterns BP1 to BP3 may be disposed as island-shaped patterns on an entire surface of the display area DA.

The first and second electrodes RME1 and RME2 of each of the first to third pixels SP1 to SP3 may be included in the fourth metal layer MTL4 on the third metal layer MTL3. The fourth metal layer MTL4 may be disposed on the via layer VIA and the first to third bank patterns BP1 to BP3. The first electrode RME1 of each of the first to third pixels SP1 to SP3 may extend in the second direction (Y-axis direction). The first electrode RME1 may cover an upper surface and the inclined side surfaces of the first bank pattern BP1. Accordingly, the first electrode RME1 may reflect light emitted from the first to fourth light emitting elements ED1 to ED4 in the upward direction (Z-axis direction).

The second electrode RME2 of each of the first to third pixels SP1 to SP3 may extend in the second direction (Y-axis direction) on a right side of the first electrode RME1. The second electrode RME2 may cover an upper surface and the inclined side surfaces of the second or third bank pattern BP2 or BP3. Accordingly, the second electrode RME2 may reflect light emitted from the first to fourth light emitting elements ED1 to ED4 in the upward direction (Z-axis direction).

The first and second light emitting elements ED1 and ED2 may be aligned between the first electrode RME1 and the second electrode RME2 on the right side of the first electrode RME1. The first insulating layer PAS1 may cover the first and second electrodes RME1 and RME2. The first and second light emitting elements ED1 and ED2 may be insulated from the first and second electrodes RME1 and RME2 by the first insulating layer PAS1. Before the first electrode RME1 is cut by the separation part ROP, the first electrode RME1 receives the alignment signal and the second electrode RME2 receives the low-potential voltage, such that an electric field may be formed between the first electrode RME1 and the second electrode RME2. Accordingly, the first and second light emitting elements ED1 and ED2 may be aligned in the second direction (Y-axis direction) between the first electrode and the second electrode RME2.

The third and fourth light emitting elements ED3 and ED4 may be aligned between the first electrode RME1 and the second electrode RME2 on the left side of the first electrode RME1. The first insulating layer PAS1 may cover the first and second electrodes RME1 and RME2. The third and fourth light emitting elements ED3 and ED4 may be insulated from the first and second electrodes RME1 and RME2 by the first insulating layer PAS1. Before the first electrode RME1 is cut by the separation part ROP, the first electrode RME1 receives the alignment signal and the second electrode RME2 receives the low-potential voltage, such that an electric field may be formed between the first electrode RME1 and the second electrodes RME2. Accordingly, the third and fourth light emitting elements ED3 and ED4 may be aligned in the second direction (Y-axis direction) between the first electrode RME1 and the second electrode RME2.

The first to fifth contact electrodes CTE1 to CTE5 of each of the first to third pixels SP1 to SP3 may be included in a fifth metal layer MTL5 on the fourth metal layer MTL4. The second insulating film PAS2 may be disposed on the first insulating film PAS1 and central portions of the light emitting elements ED. The third insulating film PAS3 may cover the second insulating film PAS2 and the first to fifth contact electrodes CTE1 to CTE5. The second and third insulating films PAS2 and PAS3 may insulate the first to fifth contact electrodes CTE1 to CTE5 from each other.

The first contact electrode CTE1 of the first pixel SP1 may be connected to the first connection electrode CE1 of the third metal layer MTL3 through the thirty second contact hole CNT32. At least a portion of the first contact electrode CTE1 of the first pixel SP1 may overlap the second electrode RME2 of the first pixel SP1. The first contact electrode CTE1 of the second pixel SP2 may be connected to the fourth connection electrode CE4 of the third metal layer MTL3 through the thirty third contact hole CNT33. At least a portion of the first contact electrode CTE1 of second pixel SP2 may overlap the second electrode RME2 of the second pixel SP2. The first contact electrode CTE1 of the third pixel SP3 may be connected to the seventh connection electrode CE7 of the third metal layer MTL3 through the thirty fourth contact hole CNT34. At least a portion of the first contact electrode CTE1 of the third pixel SP3 may overlap the second electrode RME2 of the third pixel SP3.

The first contact electrode CTE1 of the first pixel SP1 may be connected between the first connection electrode CE1 and one ends (or first ends) of the first light emitting elements ED1. The first contact electrode CTE1 may be insulated from the first and second electrodes RME1 and RME2. The first contact electrode CTE1 may correspond to an anode electrode of each of the first light emitting elements ED1, but is not limited thereto.

An upper portion of the second contact electrode CTE2 may overlap the first portion RME1a of the first electrode RME1, and a lower portion of the second contact electrode CTE2 may overlap the second electrode RME2. The second contact electrode CTE2 may be insulated from the first and second electrodes RME1 and RME2. The second contact electrode CTE2 may be connected between other ends (or second ends) of the first light emitting elements ED1 and one ends of the second light emitting elements ED2. The second contact electrode CTE2 may correspond to the third node N3 of FIG. 4. The second contact electrode CTE2 may correspond to a cathode electrode of each of the first light emitting elements ED1, but is not limited thereto. The second contact electrode CTE2 may correspond to an anode electrode of each of the second light emitting elements ED2, but is not limited thereto.

A first portion of the third contact electrode CTE3 may overlap the first portion RME1a of the first electrode RME1 and extend in the second direction (Y-axis direction). A second portion of the third contact electrode CTE3 may be bent from a lower side of the first portion and extend in an opposite direction to the first direction (X-axis direction). A third portion of the third contact electrode CTE3 may be bent from a left side of the second portion and extend in the second direction (Y-axis direction), and may overlap the second electrode RME2. The third contact electrode CTE3 may be insulated from the first and second electrodes RME1 and RME2. The third contact electrode CTE3 may be connected between other ends of the second light emitting elements ED2 and one ends of the third light emitting elements ED3. The third contact electrode CTE3 may correspond to the fourth node N4 of FIG. 4. The third contact electrode CTE3 may correspond to a cathode electrode of each of the second light emitting elements ED2, but is not limited thereto. The third contact electrode CTE3 may correspond to an anode electrode of each of the third light emitting elements ED3, but is not limited thereto.

A lower portion of the fourth contact electrode CTE4 may overlap the first portion RME1a of the first electrode RME1, and an upper portion of the fourth contact electrode CTE4 may overlap the second electrode RME2. The fourth contact electrode CTE4 may be insulated from the first and second electrodes RME1 and RME2. The fourth contact electrode CTE4 may be connected between other ends of the third light emitting elements ED3 and one ends of the fourth light emitting elements ED4. The fourth contact electrode CTE4 may correspond to the fifth node N5 of FIG. 4. The fourth contact electrode CTE4 may correspond to a cathode electrode of each of the third light emitting elements ED3, but is not limited thereto. The fourth contact electrode CTE4 may correspond to an anode electrode of each of the fourth light emitting elements ED4, but is not limited thereto.

The fifth contact electrode CTE5 may overlap the first portion RME1a of the first electrode RME1, and may be connected to the second electrode RME2 through a thirty ninth contact hole CNT39. The second electrode RME2 may be connected to the second voltage line VSL of the third metal layer MTL3 through a thirty fifth contact hole CNT35. The fifth contact electrode CTE5 may be connected between other ends of the fourth light emitting elements ED4 and the second electrode RME2. The fifth contact electrode CTE5 may correspond to a cathode electrode of each of the fourth light emitting elements ED4, but is not limited thereto. The fifth contact electrode CTE5 may receive the low-potential voltage through the second electrode RME2.

A thin film transistor TFT of the thin film transistor layer TFTL may include an active region ACT, a gate electrode GE, a drain electrode DE, and a source electrode SE. The drain electrode DE of the thin film transistor TFT may receive the driving voltage from the first voltage line VDL of the first metal layer MTL1 through a connection electrode CE.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:
1. A display device comprising:
  a pixel circuit of each of a first pixel, a second pixel, and a third pixel disposed on a substrate;
  a first vertical gate line, a second vertical gate line, and a third vertical gate line extending in a first direction and disposed on a side of the pixel circuit of each of the first to third pixels, respectively;
a horizontal gate line extending in a second direction intersecting the first direction and disposed on the first to third vertical gate lines;
a first electrode of each of the first to third pixels extending in the first direction and disposed on the horizontal gate line; and
a second electrode of each of the first to third pixels extending in the first direction, the second electrode and the first electrode being disposed in a same layer, wherein
the first electrode of the first pixel overlaps the first vertical gate line in a thickness direction, and
the first electrode of the second pixel overlaps the second vertical gate line in the thickness direction.

2. The display device of claim 1, further comprising:
a first vertical voltage line disposed on a side of the first vertical gate line and supplying a high-potential voltage,
wherein the first electrode of the first pixel overlaps the first vertical voltage line in the thickness direction.

3. The display device of claim 1, further comprising:
a first data line disposed on a side of the second vertical gate line and supplying a data voltage to the pixel circuit of the first pixel,
wherein the first electrode of the second pixel overlaps the first data line in the thickness direction.

4. The display device of claim 1, wherein the first electrode of the third pixel overlaps the third vertical gate line in the thickness direction.

5. The display device of claim 4, further comprising:
a second data line disposed on a side of the third vertical gate line and supplying a data voltage to the pixel circuit of the second pixel,
wherein the first electrode of the third pixel overlaps the second data line in the thickness direction.

6. The display device of claim 1, wherein the second electrode of each of the first to third pixels overlaps the pixel circuit of each of the first to third pixels in the thickness direction.

7. The display device of claim 1, wherein
each of the first to third pixels includes light emitting elements aligned between the first electrode and the second electrode, and
the pixel circuit of each of the first to third pixels includes:
a first transistor supplying a driving current to the light emitting element;
a second transistor electrically connecting a data line to a first node that is a gate electrode of the first transistor based on a gate signal;
a third transistor electrically connecting an initialization voltage line to a second node that is a source electrode of the first transistor based on the gate signal; and
a first capacitor electrically connected between the first node and the second node.

8. The display device of claim 1, wherein each of the first to third pixels includes:
a first light emitting element, a second light emitting element, a third light emitting element, and a fourth light emitting element aligned between the first and second electrodes;
a first contact electrode disposed on the first and second electrodes and electrically connected between the pixel circuit and the first light emitting element;
a second contact electrode electrically connected between the first and second light emitting elements;
a third contact electrode electrically connected between the second and third light emitting elements;
a fourth contact electrode electrically connected between the third and fourth light emitting elements; and
a fifth contact electrode electrically connected between the fourth light emitting element and a low potential line.

9. The display device of claim 1, further comprising:
a flexible film disposed on a side of the substrate; and
a display driver disposed on the flexible film,
wherein one of the first to third vertical gate lines supplies a gate signal received from the display driver to the horizontal gate line.

10. The display device of claim 1, wherein the first electrode includes:
a first portion extending in the first direction;
a second portion spaced apart from the first portion with the horizontal gate line being disposed between the first portion and the second portion; and
a third portion overlapping the horizontal gate line in the thickness direction and spaced apart from the first and second portions.

11. A display device comprising:
a pixel circuit of each of a first pixel, a second pixel, and a third pixel disposed on a substrate;
a first vertical gate line, a second vertical gate line, and a third vertical gate line extending in a first direction and disposed on a side of the pixel circuit of each of the first to third pixels, respectively;
a first data line, a second data line, and a third data line extending in the first direction and disposed on another side of the pixel circuit of each of the first to third pixels opposite to the side, respectively;
a horizontal gate line extending in a second direction intersecting the first direction and disposed on the first to third vertical gate lines; and
a first voltage line supplying a high-potential voltage to the pixel circuit of each of the first to third pixels, the first voltage line and the horizontal gate line being disposed in a same layer, wherein
each of the first to third pixels includes light emitting elements aligned between a first electrode and a second electrode, and
the first electrode of the first pixel overlaps the first vertical gate line in a thickness direction.

12. A electronic display device comprising:
a pixel circuit of each of a first pixel a second pixel, and a third pixel disposed on a substrate;
a first vertical gate line, a second vertical gate line, and a third vertical gate line extending in a first direction and disposed on a side of the pixel circuit of each of the first to third pixels, respectively;
a first data line, a second data line, and a third data line extending in the first direction and disposed on another side of the pixel circuit of each of the first to third pixels opposite to the side respectively;
a horizontal gate line extending in a second direction intersecting the first direction and disposed on the first to third vertical gate lines;
a first voltage line supplying a high-potential voltage to the pixel circuit of each of the first to third pixels, the first voltage line and the horizontal gate line being disposed in a same layer;

a first electrode of each of the first to third pixels extending in the first direction and disposed on the horizontal gate line; and a second electrode of each of the first to third pixels extending in the first direction, wherein the first electrode and the second electrode are disposed in a same layer.

13. The electronic display device of claim 12, wherein the first electrode of the first pixel overlaps the first vertical gate line in a thickness direction, the first electrode of the second pixel overlaps the second vertical gate line in the thickness direction, and the first electrode of the third pixel overlaps the third vertical gate line in the thickness direction.

14. The electronic display device of claim 12, further comprising:

a first vertical voltage line disposed on a side of the first vertical gate line and supplying a high-potential voltage, wherein the first electrode of the first pixel overlaps the first vertical voltage line in a thickness direction.

15. The electronic display device of claim 12, wherein the first electrode of the second pixel overlaps the first data line in a thickness direction, and the first electrode of the third pixel overlaps the second data line in the thickness direction.

16. The electronic display device of claim 12, wherein the second electrode of each of the first to third pixels overlaps the pixel circuit of each of the first to third pixels in a thickness direction.

17. The electronic display device of claim 12, wherein each of the first to third pixels includes light emitting elements aligned between the first electrode and the second electrode, and the pixel circuit of each of the first to third pixels includes:

a first transistor supplying a driving current to the light emitting elements;

a second transistor electrically connecting a data line to a first node that is a gate electrode of the first transistor based on a gate signal;

a third transistor electrically connecting an initialization voltage line to a second node that is a source electrode of the first transistor based on the gate signal; and a first capacitor electrically connected between the first node and the second node.

18. The electronic display device of claim 12, wherein each of the first to third pixels includes:

a first light emitting element, a second light emitting element, a third emitting element, and a fourth light emitting element aligned between the first and second electrodes;

a first contact electrode disposed on the first and second electrodes and electrically connected between the pixel circuit and the first light emitting element;

a second contact electrode electrically connected between the first and second light emitting elements;

a third contact electrode electrically connected between the second and third light emitting elements;

a fourth contact electrode electrically connected between the third and fourth light emitting elements; and a fifth contact electrode electrically connected between the fourth light emitting element and a low potential line.

19. The electronic display device of claim 12, further comprising:

a flexible film disposed on a side of the substrate; and a display driver disposed on the flexible film, wherein one of the first to third vertical gate lines supplies a gate signal received from the display driver to the horizontal gate line.

20. The electronic display device of claim 12, wherein the first electrode includes:

a first portion extending in the first direction;

a second portion spaced apart from the first portion with the horizontal gate line being disposed between the first portion and the second portion; and a third portion overlapping the horizontal gate line in a thickness direction and spaced apart from the first and second portions.

* * * * *